(12) United States Patent
Lee et al.

(10) Patent No.: US 11,887,672 B2
(45) Date of Patent: Jan. 30, 2024

(54) NONVOLATILE MEMORY DEVICE HAVING A DUMMY BIT LINE DRIVER AND OPERATION METHOD THEREOF

(71) Applicant: SAMSUNG ELECTRONICS CO., LTD., Suwon-si (KR)

(72) Inventors: Myeong-Woo Lee, Hwaseong-si (KR); Seungyeon Kim, Seoul (KR); Dongha Shin, Hwaseong-si (KR); Beakhyung Cho, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/693,013

(22) Filed: Mar. 11, 2022

(65) Prior Publication Data
US 2022/0301633 A1 Sep. 22, 2022

(30) Foreign Application Priority Data
Mar. 16, 2021 (KR) .................. 10-2021-0034202

(51) Int. Cl.
| | | |
|---|---|---|
| *G11C 16/16* | (2006.01) | |
| *G11C 16/24* | (2006.01) | |
| *G11C 16/30* | (2006.01) | |
| *G11C 16/28* | (2006.01) | |
| *G11C 7/10* | (2006.01) | |

(52) U.S. Cl.
CPC ............ *G11C 16/16* (2013.01); *G11C 7/1039* (2013.01); *G11C 16/24* (2013.01); *G11C 16/28* (2013.01); *G11C 16/30* (2013.01)

(58) Field of Classification Search
CPC .......... G11C 16/24; G11C 16/28; G11C 7/12; G11C 7/14; G11C 11/4094; G11C 11/4099
See application file for complete search history.

(56) References Cited

U.S. PATENT DOCUMENTS

| | | | | |
|---|---|---|---|---|
| 7,088,631 | B2* | 8/2006 | Honda .................... | G11C 16/24 365/185.21 |
| 7,349,267 | B2* | 3/2008 | Kuroda .................. | G11C 17/10 365/231 |
| 7,447,088 | B2* | 11/2008 | Yi .......................... | G11C 5/063 365/201 |
| 7,898,889 | B2* | 3/2011 | Hashimoto ............ | G11C 16/10 365/230.02 |
| 9,035,371 | B2 | 5/2015 | Nakajima | |
| 9,337,145 | B2* | 5/2016 | Shinohara .............. | H10B 43/27 |
| 9,431,415 | B2 | 8/2016 | Shin et al. | |
| 9,634,023 | B2 | 4/2017 | Lee | |

(Continued)

FOREIGN PATENT DOCUMENTS

KR 101374338 B1 3/2014

*Primary Examiner* — Kretelia Graham
(74) *Attorney, Agent, or Firm* — Fish & Richardson P.C.

(57) ABSTRACT

A nonvolatile memory device includes a plurality of bit lines that is connected with a plurality of cell strings, a common source line that is connected with the plurality of cell strings, at least one dummy bit line that is provided between the common source line and the plurality of bit lines, a control logic circuit that generates at least one dummy bit line driving signal in response to a command from an external device, and a dummy bit line driver that selectively provides a first voltage to the at least one dummy bit line in response to the dummy bit line driving signal.

20 Claims, 26 Drawing Sheets

(56) References Cited

U.S. PATENT DOCUMENTS

| | | |
|---|---|---|
| 10,546,814 B2 * | 1/2020 | Tak ........................ H10B 41/35 |
| 10,573,659 B2 | 2/2020 | Oh et al. |
| 2009/0034336 A1 | 2/2009 | Kwak et al. |
| 2009/0124072 A1 | 5/2009 | Park et al. |
| 2019/0237472 A1 | 8/2019 | Oh et al. |
| 2019/0267333 A1 | 8/2019 | Hong et al. |
| 2020/0219898 A1 | 7/2020 | Kanamori et al. |
| 2020/0273522 A1 | 8/2020 | Shin et al. |

* cited by examiner

[ERS Operation]

[ERS Operation]

[ERS Operation]

NONVOLATILE MEMORY DEVICE HAVING A DUMMY BIT LINE DRIVER AND OPERATION METHOD THEREOF

CROSS-REFERENCE TO RELATED APPLICATIONS

This application claims priority under 35 U.S.C. § 119 to Korean Patent Application No. 10-2021-0034202 filed on Mar. 16, 2021, in the Korean Intellectual Property Office, the disclosure of which is incorporated by reference herein in its entirety.

BACKGROUND

Embodiments of the disclosure relate to a semiconductor memory, and more particularly, relate to a nonvolatile memory device and an operation method thereof.

A semiconductor memory device is classified as a volatile memory device, in which stored data disappear when a power supply is interrupted, such as a static random access memory (SRAM) or a dynamic random access memory (DRAM), or a nonvolatile memory device, in which stored data are retained even when a power supply is interrupted, such as a flash memory device, a phase-change RAM (PRAM), a magnetic RAM (MRAM), a resistive RAM (RRAM), or a ferroelectric RAM (FRAM).

In a read operation, the flash memory device reads data stored in memory cells by sensing voltage changes of bit lines connected with the memory cells. In this case, a current may flow through a common source line connected with the memory cells and noise due to a current of the common source line may be introduced to the bit lines. That is, voltages of the bit lines may be affected by the noise due to the current of the common source line, thereby causing the reduction of reliability of the flash memory device.

SUMMARY

Embodiments of the present disclosure provide a nonvolatile memory device having improved reliability and improved performance by minimizing the influence of noise due to a common source line and an operation method thereof.

According to an embodiment, a nonvolatile memory device includes a plurality of bit lines that is connected with a plurality of cell strings, a common source line that is connected with the plurality of cell strings, at least one dummy bit line that is provided between the common source line and the plurality of bit lines, a control logic circuit that generates at least one dummy bit line driving signal in response to a command from an external device, and a dummy bit line driver that selectively provides a first voltage to the at least one dummy bit line in response to the dummy bit line driving signal.

According to an embodiment, a nonvolatile memory device includes a peripheral circuit formed on a semiconductor substrate, a memory cell array formed on the peripheral circuit and including a plurality of cell strings, and a metal layer formed on the memory cell array. The metal layer includes a plurality of bit lines connected with the plurality of cell strings, a common source line connected with the plurality of cell strings, and at least one dummy bit line provided between the plurality of bit lines and the common source line. The peripheral circuit includes a control logic circuit that generates at least one dummy bit line driving signal in response to a command from an external device and a dummy bit line driver that selectively provides a first voltage to the at least one dummy bit line in response to the at least one dummy bit line driving signal.

According to an embodiment, an operation method of a nonvolatile memory device includes: (1) receiving a read command from an external device, (2) applying a first voltage to at least one dummy bit line present between a plurality of bit lines and a common source line in response to the read command, (3) performing a read operation in response to the read command, (4) receiving an erase command from the external device, (5) in response to the erase command, floating the at least one dummy bit line, (6) electrically connecting the at least one dummy bit line and the common source line or applying an erase voltage to the at least one dummy bit line, and (7) performing an erase operation in response to the erase command.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure may be described in detail and clearly to such an extent that one skilled in the art easily may carry out the present disclosure.

Figure 1:
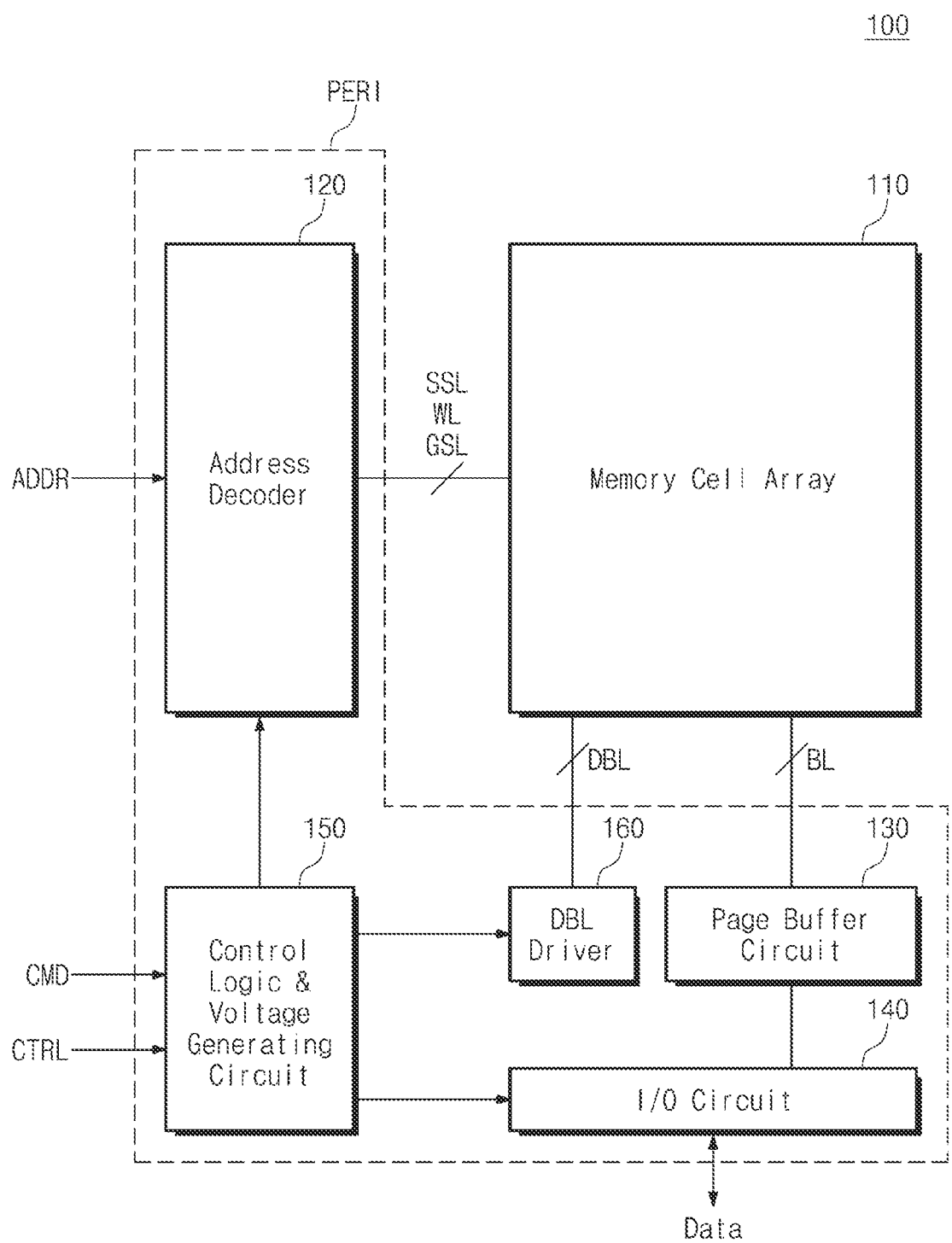
FIG. 1 is a block diagram illustrating a nonvolatile memory device according to an embodiment of the present disclosure.

FIG. 1 is a block diagram illustrating a nonvolatile memory device according to an embodiment of the present disclosure. Referring to FIG. 1, a nonvolatile memory device 100 may include a memory cell array 110, an address decoder 120, a page buffer circuit 130, an input/output circuit 140, a control logic and voltage generating circuit 150, and a dummy bit line driver 160. In an embodiment, the remaining components other than the memory cell array 110, for example, the address decoder 120, the page buffer circuit 130, the input/output circuit 140, the control logic and voltage generating circuit 150, and the dummy bit line driver 160 may be included in a peripheral circuit PERI. In an embodiment, the nonvolatile memory device 100 may have a cell on peripheral (COP) or CMOS under array (CUA) structure in which the memory cell array 110, a memory cell structure, or a memory cell area is stacked on the peripheral circuit PERI (or a peripheral circuit area).

The memory cell array 110 may include a plurality of memory blocks. Each of the plurality of memory blocks may include a plurality of cell strings, and each of the plurality of cell strings may be connected with a plurality of bit lines BL. Each of the plurality of cell strings may include a plurality of cell transistors connected in series. The plurality of cell transistors may be connected with string selection lines SSL, word lines WL, and ground selection lines GSL.

The address decoder 120 may be connected with the memory cell array 110 through the string selection lines SSL, the word lines WL, and the ground selection lines GSL. The address decoder 120 may receive an address ADDR from an external device (e.g., a memory controller) and may decode the received address ADDR. The address decoder 120 may control or drive the string selection lines SSL, the word lines WL, and the ground selection lines GSL based on the decoded address ADDR.

The page buffer circuit 130 may be connected with the memory cell array 110 through the bit lines BL. The page buffer circuit 130 may read data stored in the memory cells of the memory cell array 110 by sensing voltage changes of the bit lines BL. The page buffer circuit 130 may provide the read data to the input/output circuit 140. The page buffer circuit 130 may be configured to temporarily store data "DATA" received through the input/output circuit 140. The page buffer circuit 130 may control or drive the bit lines BL based on the temporarily stored data "DATA".

The input/output circuit 140 may exchange the data "DATA" with the external device (e.g., a memory controller). The input/output circuit 140 may provide the data "DATA" received from the external device to the page buffer circuit 130 or may send the data "DATA" received from the page buffer circuit 130 to the external device.

The control logic and voltage generating circuit 150 (hereinafter referred to as a "control logic circuit") may be configured to generate the following voltages necessary for the nonvolatile memory device 100 to operate: a plurality of program voltages, a plurality of program verification voltages, a plurality of pass voltages, a plurality of read voltages, and a plurality of erase voltages.

The control logic circuit 150 may control an operation of the nonvolatile memory device 100 in response to a command CMD and a control signal CTRL from the external device. For example, the control logic circuit 150 may control the address decoder 120, the page buffer circuit 130, the input/output circuit 140, and the dummy bit line driver 160 in response to the command CMD such that an operation (e.g., a program operation, a read operation, or an erase operation) corresponding to the command CMD is performed.

The dummy bit line driver 160 may be connected with dummy bit lines DBL of the memory cell array 110. The dummy bit line driver 160 may be configured to control voltages of the dummy bit lines DBL or to provide a bias thereto, under control of the control logic circuit 150. For example, the memory cell array 110 may include the dummy bit lines DBL. The dummy bit lines DBL may indicate bit lines that are formed in the same layer (e.g., a metal layer on the memory cell array 110) as the bit lines BL of the memory cell array 110 so as to have a pattern similar to that of the bit lines BL but are not electrically connected with cell transistors or the page buffer circuit 130. Alternatively, the dummy bit lines DBL may indicate bit lines that are formed in the same shape or structure as the bit lines BL but are not used in an operation (e.g. a read operation, a program operation, or an erase operation) of the nonvolatile memory device 100.

The dummy bit line driver 160 may control voltages of the dummy bit lines DBL under control of the control logic circuit 150. As the dummy bit lines DBL are controlled by the dummy bit line driver 160, a noise caused by the common source line CSL of the memory cell array 110 may not be introduced into the bit lines BL, and thus, the reliability of operation of the nonvolatile memory device 100 may be improved. A configuration and an operation of the dummy bit line driver 160 will be described in more detail with reference to the following drawings.

Figure 2:
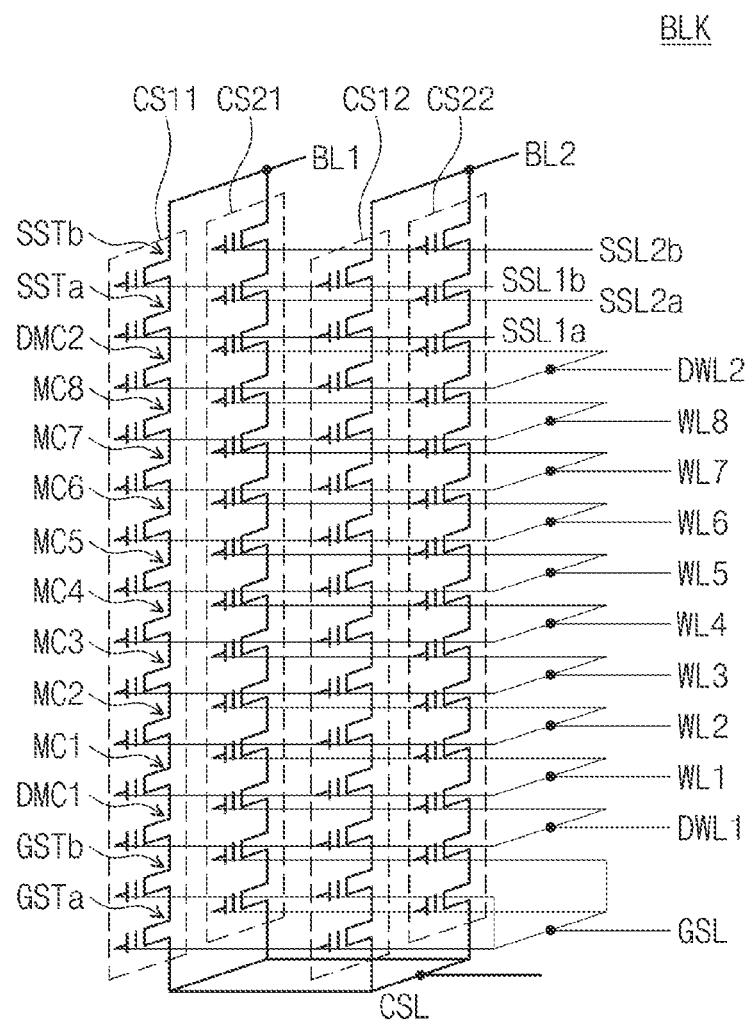
FIG. 2 is a circuit diagram illustrating an embodiment of one memory block BLK of a plurality of memory blocks included in a memory cell array of FIG. 1.

FIG. 2 is a circuit diagram illustrating an embodiment of one memory block BLK of a plurality of memory blocks included in a memory cell array of FIG. 1. One memory block BLK will be described with reference to FIG. 2, but the present disclosure is not limited thereto. A plurality of memory blocks included in the memory cell array 110 may be the same as or similar in structure to the memory block BLK of FIG. 2. Referring to FIGS. 1 and 2, the memory block BLK may include a plurality of cell strings CS11, CS12, CS21, and CS22. The plurality of cell strings CS11, CS12, CS21, and CS22 may be arranged in a row direction and a column direction.

Cell strings placed at the same column from among the plurality of cell strings CS11, CS12, CS21, and CS22 may be connected with the same bit line. For example, the cell strings CS11 and CS21 may be connected with a first bit line BL1, and the cell strings CS12 and CS22 may be connected with a second bit line BL2. Each of the plurality of cell strings CS11, CS12, CS21, and CS22 may include a plurality of cell transistors. Each of the plurality of cell transistors may include a charge trap flash (CTF) memory cell, but the present disclosure is not limited thereto. The plurality of cell transistors may be stacked in a height direction that is a direction perpendicular to a plane (e.g., a semiconductor substrate (not illustrated) or the peripheral circuit PERI) defined by the row direction and the column direction.

In each cell string, the plurality of cell transistors may be connected in series between a corresponding bit line (e.g., BL1 or BL2) and the common source line CSL. For example, in each cell string, the plurality of cell transistors may include string selection transistors SSTa and SSTb, dummy memory cells DMC1 and DMC2, memory cells MC1 to MC8, and ground selection transistors GSTa and GSTb. The string selection transistors SSTa and SSTb that are connected in series may be provided or connected between the serially-connected memory cells MC1 to MC8 and the corresponding bit line (e.g., BL1 and BL2). The ground selection transistors GSTa and GSTb that are connected in series may be provided or connected between the serially-connected memory cells MC1 to MC8 and the common source line CSL. In an embodiment, the second dummy memory cell DMC2 may be provided between the serially-connected string selection transistors SSTa and SSTb and the serially-connected memory cells MC1 to MC8 and the first dummy memory cell DMC1 may be provided between the serially-connected memory cells MC1 to MC8 and the serially-connected ground selection transistors GSTa and GSTb.

In each of the plurality of cell strings CS11, CS12, CS21, and CS22, memory cells placed at the same height from among the memory cells MC1 to MC8 may share the same word line. For example, the first memory cells MC1 of the plurality of cell strings CS11, CS12, CS21, and CS22 may be placed at the same height from the substrate (not illustrated) and may share a first word line WL1. The second memory cells MC2 of the plurality of cell strings CS11, CS12, CS21, and CS22 may be placed at the same height from the substrate (not illustrated) and may share a second word line WL2. Likewise, the third to eighth memory cells MC3 to MC8 of the plurality of cell strings CS11, CS12, CS21, and CS22 may be placed at the same heights from the substrate and may share third to eighth word lines WL3 to WL8, respectively.

Dummy memory cells placed at the same height from among the dummy memory cells DMC1 and DMC2 of the plurality of cell strings CS11, CS12, CS21, and CS22 may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2. In an embodiment, dummy word lines may be added for a multi-stacked structure. For example, a dummy word line may be added between word lines (e.g., WL4 and WL5) and may be connected with dummy memory cells added between memory cells (e.g., MC4 and MC5). However, the present disclosure is not limited thereto.

String selection transistors placed at the same height and the same row from among the string selection transistors SSTa and SSTb of the plurality of cell strings CS11, CS12, CS21, and CS22 may share the same string selection line. For example, the string selection transistors SSTb of the cell strings CS11 and CS12 may be connected with a string selection line SSL1b and the string selection transistors SSTa of the cell strings CS11 and CS12 may be connected with a string selection line SSL1a. The string selection transistors SSTb of the cell strings CS21 and CS22 may be connected with a string selection line SSL2b, and the string selection transistors SSTa of the cell strings CS21 and CS22 may be connected with a string selection line SSL2a.

Although not illustrated in FIG. 2, string selection transistors placed at the same row from among the string selection transistors SSTa and SSTb of the plurality of cell strings CS11, CS12, CS21, and CS22 may share the same string selection line. For example, the string selection transistors SSTb and SSTa of the cell strings CS11 and CS12 may share a first string selection line, and the string selection transistors SSTb and SSTa of the cell strings CS21 and CS22 may share a second string selection line different from the first string selection line.

Ground selection transistors placed at the same height and the same row from among the ground selection transistors GSTa and GSTb of the plurality of cell strings CS11, CS12, CS21, and CS22 may share the same ground selection line. Although not illustrated in FIG. 2, the ground selection transistors GSTb of the cell strings CS11 and CS12 may be connected with a first ground selection line and the ground selection transistors GSTa of the cell strings CS11 and CS12 may share a second ground selection line. The ground selection transistors GSTb of the cell strings CS21 and CS22 may be connected with a third ground selection line, and the ground selection transistors GSTa of the cell strings CS21 and CS22 may share a fourth ground selection line.

As illustrated in FIG. 2, the ground selection transistors GSTb and GSTa of the plurality of cell strings CS11, CS12, CS21, and CS22 may share the same ground selection line GSL. Alternatively, ground selection transistors placed at the same height from among the ground selection transistors GSTb and GSTa of the plurality of cell strings CS11, CS12, CS21, and CS22 may share the same ground selection line. Alternatively, ground selection transistors placed at the same row from among the ground selection transistors GSTb and GSTa of the plurality of cell strings CS11, CS12, CS21, and CS22 may share the same ground selection line.

In an embodiment, although not illustrated in FIG. 2, each of the plurality of cell strings CS11, CS12, CS21, and CS22 of the memory block BLK may further include an erase control transistor (ECT). The erase control transistors of the plurality of cell strings CS11, CS12, CS21, and CS22 may be placed at the same height from the substrate and may be connected with the same erase control line (ECL). For example, in each of the plurality of cell strings CS11, CS12, CS21, and CS22, the erase control transistor may be interposed between the ground selection transistor GSTa and the common source line CSL. Alternatively, in each of the plurality of cell strings CS11, CS12, CS21, and CS22, the erase control transistor may be interposed between the corresponding bit line BL1 or BL2 and the string selection transistor SSTb. However, the present disclosure is not limited thereto.

In an embodiment, the memory block BLK illustrated in FIG. 2 is an example; the number of cell strings may increase or decrease, and the number of rows of cell strings and the number of columns of cell strings may increase or decrease depending on the change in the number of cell strings. Also, the number of cell transistors (e.g., GST, MC, DMC, and SST) in the memory block BLK may increase or decrease and the height of the memory block BLK may increase or decrease depending on the number of cell transistors (e.g., GST, MC, DMC, and SST). In addition, depending on the number of cell transistors, the number of lines (e.g., GSL, WL, DWL, and SSL) connected with the cell transistors may increase or decrease.

Figure 3:
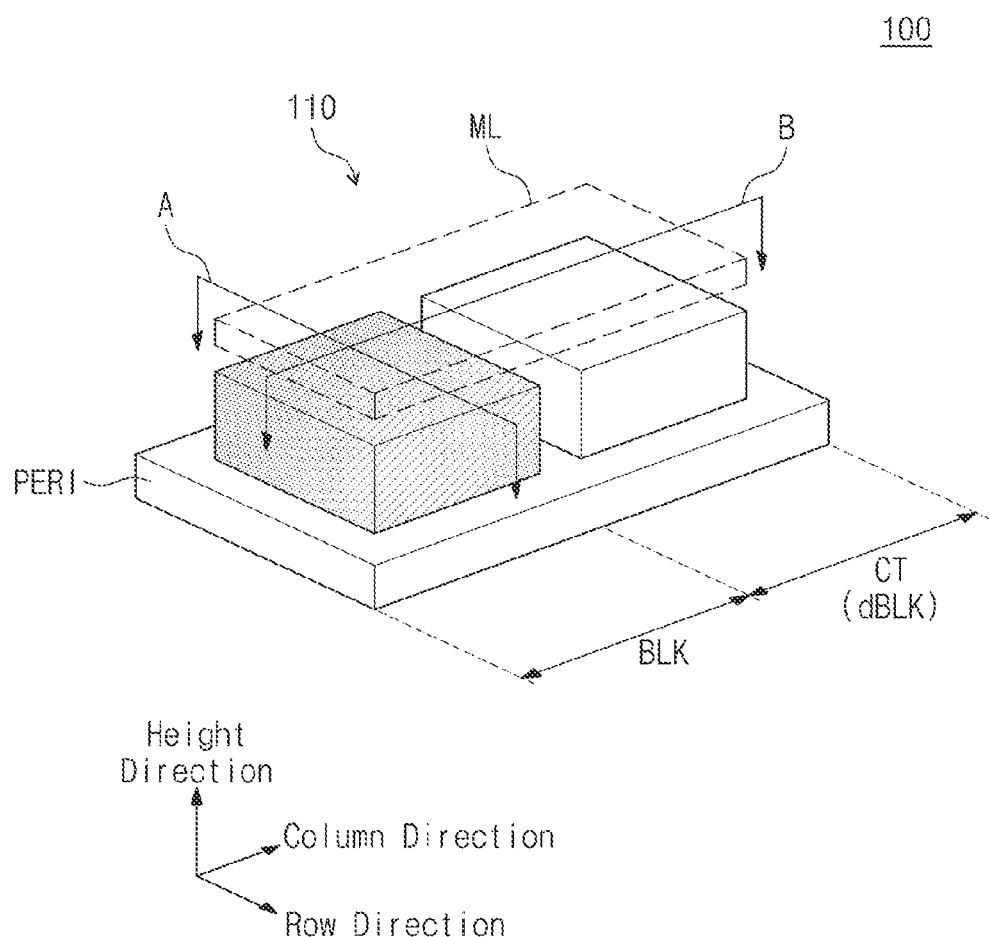
FIG. 3 is a perspective view illustrating a nonvolatile memory device of FIG. 1.

FIG. 3 is a perspective view illustrating a nonvolatile memory device of FIG. 1. Below, for convenience of description, a schematic structure of the nonvolatile memory device 100 will be described with reference to one memory block BLK, but the present disclosure is not limited thereto. Also, for brevity of drawing and for convenience of description, only a configuration associated with the technical idea of the disclosure will be described, but the present disclosure is not limited thereto.

Referring to FIGS. 1 to 3, the peripheral circuit PERI of the nonvolatile memory device 100 may be formed on a plane (e.g., a semiconductor substrate) defined by the row direction and the column direction. The memory block BLK of a three-dimensional structure may be formed on the peripheral circuit PERI or in a direction perpendicular to the peripheral circuit PERI, that is, in a height direction. That is, the nonvolatile memory device 100 may have a COP structure.

Various signal lines (e.g., a bit line BL, a word line WL, a string selection line SSL, a ground selection line GSL, and the common source line CSL) of the memory block BLK may be connected with the peripheral circuit PERI through conductive lines included in a metal layer ML. In an embodiment, in a contact region CT, the bit lines BL of the memory block BLK may be connected with the peripheral circuit PERI. For example, the bit lines BL of the memory block BLK may be electrically connected with the conductive lines of the metal layer ML. A dummy memory block dBLK that is similar in structure to the memory block BLK may be formed in the contact region CT, and the conductive lines of the metal layer ML and the peripheral circuit PERI (in particular, the page buffer circuit 130) may be electrically connected thereto by using a through plug penetrating the dummy memory block dBLK in the height direction. In an embodiment, the page buffer circuit 130 may be formed in the contact region CT of the peripheral circuit PERI.

Figure 4:
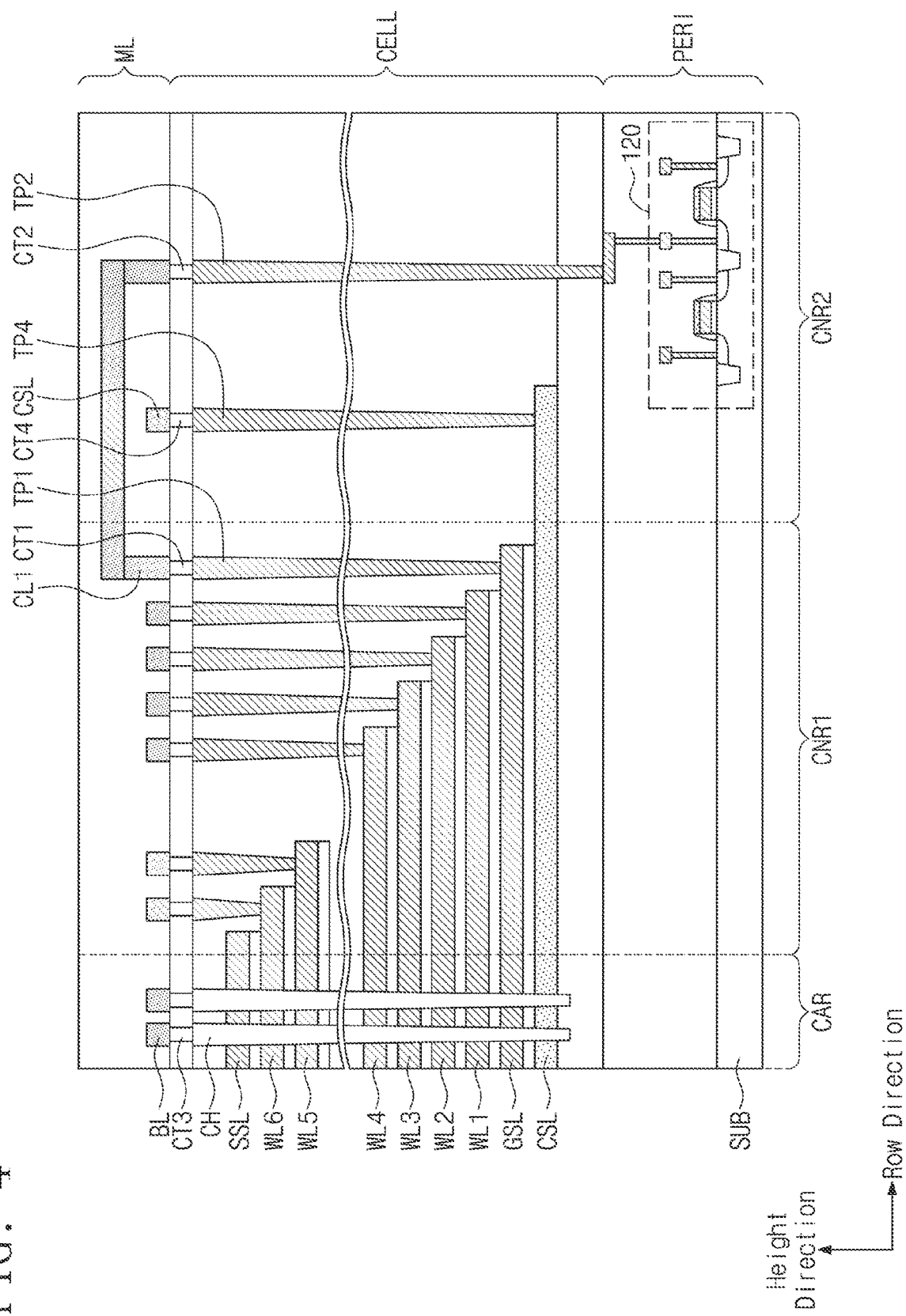
FIG. 4 illustrates a cross-section view of a nonvolatile memory device taken along line "A" of FIG. 3.
Figure 5:
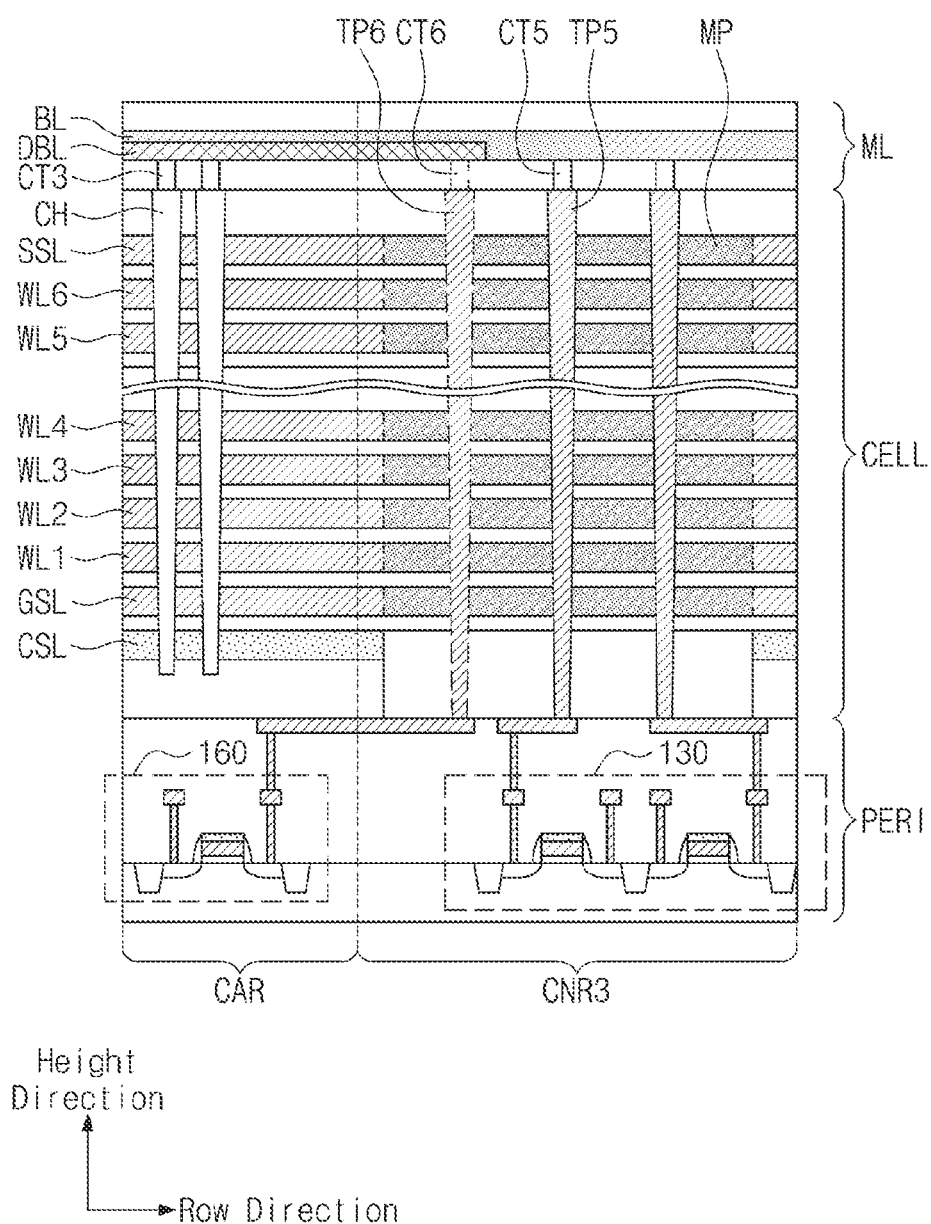
FIG. 5 illustrates a cross-section view of a nonvolatile memory device taken along line "B" of FIG. 3.

FIG. 4 illustrates a cross-section view of a nonvolatile memory device taken along line "A" of FIG. 3. FIG. 5 illustrates a cross-section view of a nonvolatile memory device taken along line "B" of FIG. 3. For brevity of drawing and for convenience of description, components that are unnecessary to describe an embodiment of the present disclosure and detailed descriptions thereof will be omitted. For example, some string selection lines, some word lines, some ground selection lines, etc. of a memory block BLK will be omitted, but the present disclosure is not limited thereto.

Referring to FIGS. 1, 3, 4, and 5, the peripheral circuit PERI may be formed on a semiconductor substrate SUB. A cell area CELL may be formed from an upper portion of the peripheral circuit PERI or from the peripheral circuit PERI along a height direction. The cell area CELL may indicate an area where the memory block BLK is formed. In the cell area CELL, the common source line CSL, a ground selection line GSL, word lines WL1 to WL6, and a string selection line SSL may be vertically stacked from the peripheral circuit PERI in the height direction.

In a first contact region CNR1, the common source line CSL, the ground selection line GSL, the word lines WL1 to WL6, and the string selection line SSL may be formed in a stair shape. For example, in the first contact region CNR1, lengths of the common source line CSL, the ground selection line GSL, the word lines WL1 to WL6, and the string selection line SSL in the row direction may decrease as a distance from the peripheral circuit PERI increases.

In the first contact region CNR1, the ground selection line GSL, the word lines WL1 to WL6, and the string selection line SSL may be connected with first contact plugs CT1 through first through plugs TP1. The first contact plugs CT1 may be connected with first conductive lines CL1 of a metal layer ML. In the cell area CELL, the first through plugs TP1 may be formed along the height direction (i.e., a direction perpendicular to the peripheral circuit PERI). In an embodiment, the first through plugs TP1 or through plugs to be described below may indicate a vertical through structure such as a through silicon via (TSV) or a through hole via (THV). In an embodiment, the metal layer ML may include a plurality of layers for providing various wires or patterns of the conductive lines CL1.

The first conductive lines CL1 of the metal layer ML may be connected with a second contact plug CT2 in a second contact region CNR2. The second contact plug CT2 may be electrically connected with the peripheral circuit PERI through a second through plug TP2. In an embodiment, as illustrated in FIG. 4, the first word line WL1 may be electrically connected with the peripheral circuit PERI, in particular, the address decoder 120 through the first through plug TP1, the first contact plug CT1, the first conductive line CL1, the second contact plug CT2, and the second through plug TP2. The above connection structures of the word lines WL1 to WL6 of the memory block BLK are simple examples, and the present disclosure is not limited thereto.

Channels CH may be provided in a cell core region CAR. The channels CH may be provided to penetrate the common source line CSL, the ground selection line GSL, the word lines WL1 to WL6, and the string selection line SSL, which are vertically stacked. The channels CH may be connected with the bit lines BL through third contacts CT3.

In an embodiment, the metal layer ML may include a conductive line corresponding to the common source line CSL. The conductive line corresponding to the common source line CSL may be connected with the common source line CSL of the cell region CELL through a fourth contact plug CT4 and a fourth through plug TP4. In an embodiment, in the metal layer ML, the common source line CSL may be connected in common with the whole or part of the memory cell array through a mesh structure or a ring structure. In an embodiment, in the cell region CELL, the common source line CSL may be connected in common with the whole or part of the memory cell array through a mesh structure or a ring structure.

Next, as illustrated in FIG. 5, the bit line BL electrically connected with the channel CH and the third contact plug CT3 may be extended in the column direction. In a third contact region CNR3, the bit line BL extended in the column direction in the metal layer ML may be electrically connected with the page buffer circuit 130 of the peripheral circuit PERI through a fifth contact plug CT5 and a fifth through plug TP5. In an embodiment, the third contact region CNR3 may be a region that corresponds to the contact region CT or the dummy block dBLK illustrated in FIG. 3. That is, the third contact region CNR3 may indicate a region (e.g., a bit line contact region) where through plugs electrically connecting the bit lines BL and the page buffer circuit 130 are formed. In the third contact region CNR3, a region corresponding to the ground selection line GSL, the word lines WL1 to WL6, and the string selection line SSL may be provided by a mold pattern MP.

In an embodiment, the dummy bit line DBL may be extended along the row direction in the cell core region CAR and may be electrically connected with the dummy bit line driver 160 of the peripheral circuit PERI through a sixth contact plug CT6 and a sixth through plug TP6 in the third contact region CNR3. In an embodiment, the dummy bit line DBL may indicate a bit line that is formed in the same pattern as the bit line BL in the metal layer ML but is not electrically connected with the channel CH. Alternatively, the dummy bit line DBL may be electrically connected with a channel and the bit line BL, but the channel connected with the dummy bit line DBL may be different in structure from the channel CH connected with the bit line BL.

In an embodiment, the page buffer circuit 130 may be provided in the third contact region CNR3 of the peripheral circuit PERI and the dummy bit line driver 160 may be provided at a location different from a location of the third contact region CNR3 of the peripheral circuit PERI. That is, the dummy bit line DBL may be connected with the peripheral circuit PERI through the sixth through plug TP6 formed in a region (i.e., the third contact region CNR3) where the fifth through plugs TP5 for electrically connecting the bit line BL and the page buffer circuit 130 of the peripheral circuit PERI are provided, but the dummy bit line driver 160 electrically connected with the dummy bit line DBL may be provided at a location different from a location of the third contact region CNR3 or at a location different from a location of the page buffer circuit 130.

Figure 6:
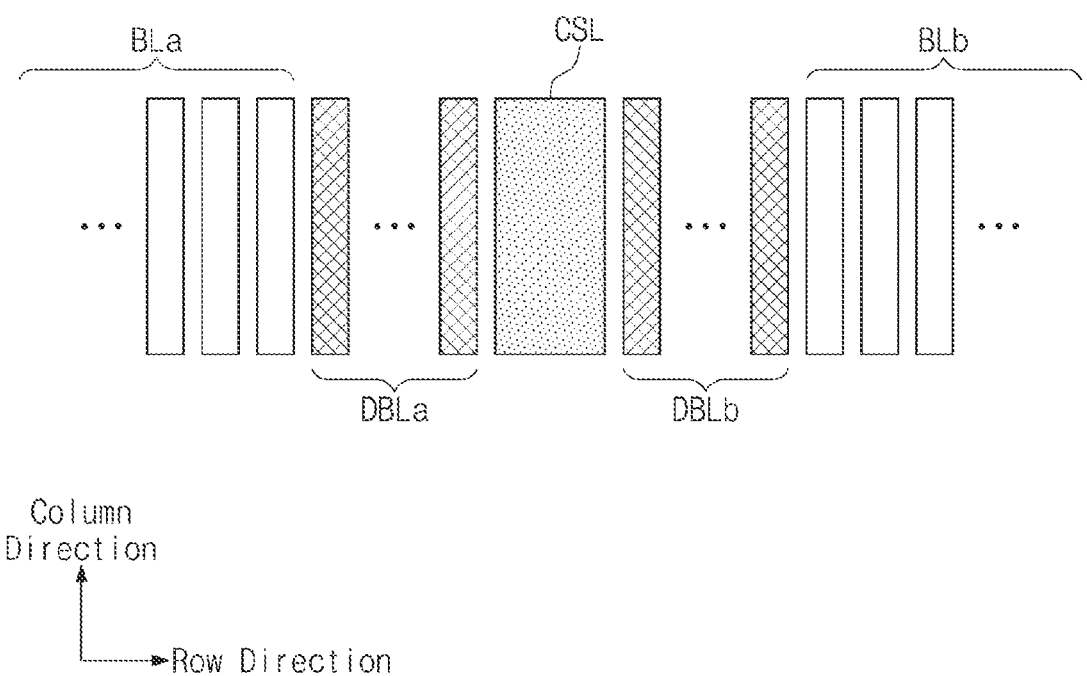
FIG. 6 is a plan view illustrating a cell core region in a metal layer of FIG. 3.

FIG. 6 is a plan view illustrating a cell core region in a metal layer of FIG. 3. Referring to FIGS. 3 and 6, in a cell core region of the metal layer ML of the nonvolatile memory device 100, the common source line CSL, dummy bit lines DBLa and DBLb, and bit lines BLa and BLb may be extended along the column direction. The common source line CSL, the dummy bit lines DBLa and DBLb, and the bit lines BLa and BLb may be arranged along the row direction.

The bit lines BLa and BLb may be electrically connected with channels or memory cells of a plurality of memory blocks. In the metal layer ML, the dummy bit lines DBLa and DBLb may be interposed between the common source line CSL and the bit lines BLa and between the common source line CSL and the bit lines BLb. For example, the dummy bit lines DBLa may be interposed between the common source line CSL and the bit lines BLa and the dummy bit lines DBLb may be interposed between the common source line CSL and the bit lines BLb.

In an embodiment, when a level of the common source line CSL changes, noise caused by the common source line CSL may be introduced into the bit lines BLa and BLb. For example, when the nonvolatile memory device 100 performs a read operation or a program verification operation, a large current may flow into the common source line CSL. The large current flowing into the common source line CSL causes noise at the bit lines BLa and BLb. This noise reduces the reliability of read data.

In an embodiment, the dummy bit line driver 160 according to the present disclosure may be configured to control a level of the dummy bit lines DBLa and DBLb depending on an operation of the nonvolatile memory device 100. In this case, the noise caused by the common source line CSL may be blocked or may be prevented from being introduced into the bit lines BLa and BLb.

Figure 7:
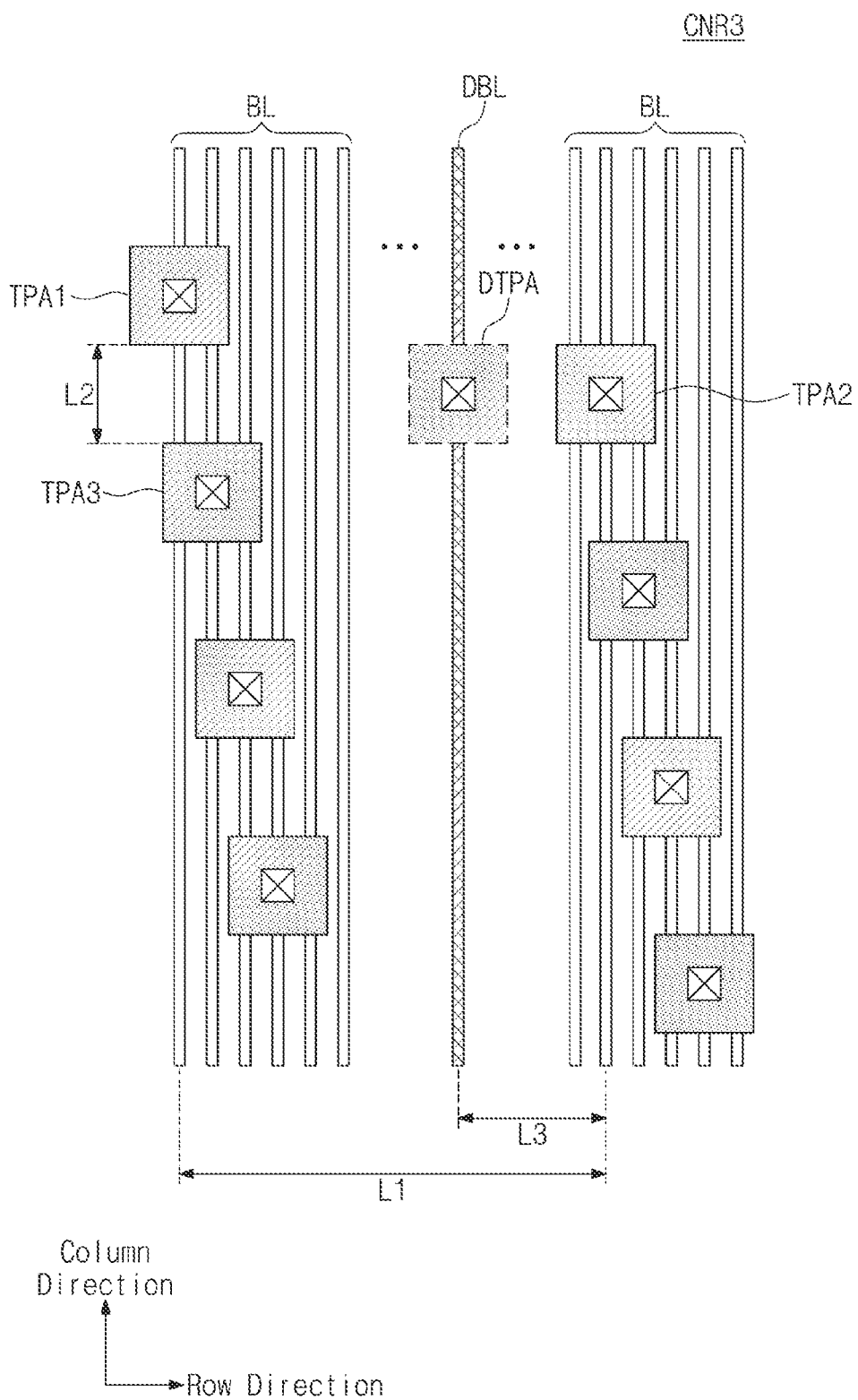
FIG. 7 is a plan view illustrating a third contact region in a metal layer of FIG. 5.

FIG. 7 is a plan view illustrating a third contact region in a metal layer of FIG. 5. Referring to FIGS. 5 and 7, the plurality of bit lines BL and the dummy bit line DBL may be provided in the third contact region CNR3 of the metal layer ML. In an embodiment, the plurality of bit lines BL and the dummy bit line DBL provided in the third contact region CNR3 of the metal layer ML may be electrically connected with the bit lines BLa and BLb and the dummy bit lines DBLa and DBLb, which are described with reference to FIG. 6, through various conductive lines of the metal layer ML.

In the third contact region CNR3 of the metal layer ML, the bit lines BL may be electrically connected with the page buffer circuit 130 of the peripheral circuit PERI through the through plugs TP formed in through plug areas TPA. In this case, the through plug areas TPA connected with the bit lines BL may be arranged at a regular interval or pitch. For example, a distance between a first through plug area TPA1 and a second through plug area TPA2 adjacent to the first through plug area TPA1 in the row direction may be a first length L1 and a distance between the first through plug area TPA1 and a third through plug area TPA3 adjacent to the first through plug area TPA1 in the column direction may be a second length L2. That is, the through plug areas TPA configured to be connected to the bit lines BL may be formed in the third contact region CNR3 with a regular or uniform pattern.

The dummy bit line DBL may be electrically connected with the dummy bit line driver 160 of the peripheral circuit PERI through a dummy through plug area DTPA. In the third contact region CNR3, the dummy through plug areas DTPA may be formed irregularly in pattern or location, compared to the through plug areas TPA. For example, a distance between the dummy through plug area DTPA and the second through plug area TPA2 adjacent to the dummy through plug area DTPA in the row direction may be a third distance L3. Here, the third distance L3 may be shorter than the first distance L1. That is, the dummy through plug area DTPA electrically connected with the dummy bit line DBL may be formed between the through plug areas TPA formed to have a regular pattern. The dummy through plug areas DTPA may be irregular compared to the arrangement of the through plug areas TPA.

One dummy through plug area DTPA is illustrated in FIG. 7, but the present disclosure is not limited thereto. For example, the number of dummy through plug areas DTPA may be variously changed. In an embodiment, in a metal layer (not illustrated) of the peripheral circuit PERI, the dummy through plug areas DTPA may be connected in common with the dummy bit line driver 160 through a ring structure or a mesh structure.

Figure 8:
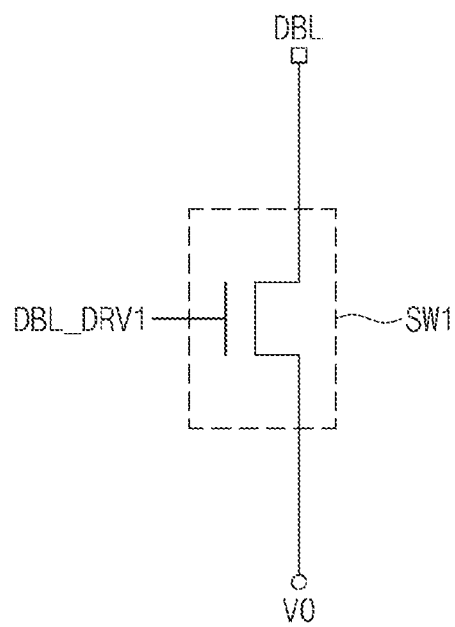
FIG. 8 is a circuit diagram illustrating a dummy bit line driver of FIG. 1.

FIG. 8 is a circuit diagram illustrating a dummy bit line driver of FIG. 1. Below, for convenience of description, it is assumed that a dummy bit line driven or controlled by the dummy bit line driver 160 is a dummy bit line adjacent to a common source line in the cell core region CAR. That is, in FIG. 6, it is assumed that one dummy bit line being the most closely adjacent to the common source line CSL from among the dummy bit lines DBLa and one dummy bit line being the most closely adjacent to the common source line CSL from among the dummy bit lines DBLb are driven or controlled by the dummy bit line driver 160. However, the present disclosure is not limited thereto. For example, a dummy bit line that is driven or controlled by the dummy bit line driver 160 may be at least one dummy bit line being the most closely adjacent to the common source line CSL from among the dummy bit lines DBLa, at least one dummy bit line being the most closely adjacent to the bit lines BLa, or at least one of the dummy bit lines DBLa. That is, a dummy bit line that is driven or controlled by the dummy bit line driver 160 may be variously changed.

Referring to FIGS. 1 and 8, the dummy bit line driver 160 may include a first switch SW1 connected between the dummy bit line DBL and a 0-th voltage V0. The first switch SW1 may operate in response to a first dummy bit line driving signal DBL_DRV1. In response to the first dummy bit line driving signal DBL_DRV1, the first switch SW1 may provide the 0-th voltage V0 to the dummy bit line DBL or may block the supply of the 0-th voltage V0 to the dummy bit line DBL. In an embodiment, the first switch SW1 may be implemented with an NMOS transistor element, but the present disclosure is not limited thereto.

In an embodiment, the 0-th voltage V0 may be a ground voltage GND or VSS, but the present disclosure is not limited thereto. For example, the 0-th voltage V0 may be a predetermined positive voltage or a predetermined negative voltage.

When the 0-th voltage V0 is provided to the dummy bit line DBL, the dummy bit line DBL may maintain the 0-th voltage V0. In this case, a noise caused by a large current of the common source line CSL may be prevented from being introduced into the bit lines BL.

Figure 9:
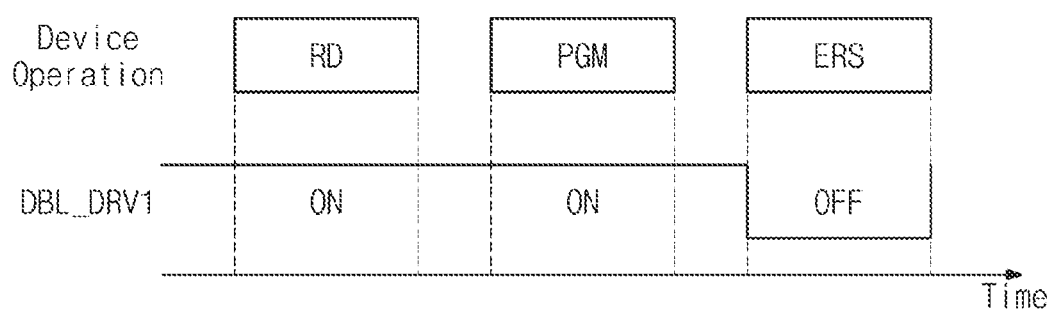
FIG. 9 is a timing diagram for describing a first dummy bit line driving signal provided to a dummy bit line driver of FIG. 8.

FIG. 9 is a timing diagram for describing a first dummy bit line driving signal provided to a dummy bit line driver of FIG. 8. Referring to FIGS. 1, 8, and 9, the control logic circuit 150 may control the first dummy bit line driving signal DBL_DRV1 depending on an operation of the nonvolatile memory device 100. For example, the nonvolatile memory device 100 may perform a read operation RD, a program operation PGM, and an erase operation ERS.

The control logic circuit 150 may generate the first dummy bit line driving signal DBL_DRV1 such that the first switch SW1 of the dummy bit line driver 160 is turned on during the read operation RD or the program operation PGM of the nonvolatile memory device 100 and the first switch SW1 of the dummy bit line driver 160 is turned off during the erase operation ERS of the nonvolatile memory device 100.

For example, while the nonvolatile memory device 100 performs the read operation RD, a current may flow through the common source line CSL and a noise caused by the current of the common source line CSL may be introduced into bit lines BL adjacent thereto. In this case, the 0-th voltage V0 may be applied to the dummy bit lines DBL between the common source line CSL and the bit lines BL through the operation of the dummy bit line driver 160, and thus, the noise due to the current of the common source line CSL may be prevented from being introduced to the bit lines BL. In an embodiment, a program verification phase of the program operation PGM of the nonvolatile memory device 100 may be performed by a mechanism similar to that of the read operation RD and a noise due to a current of the common source line CSL may be blocked by an operation similar to the operation described above.

In an embodiment, the nonvolatile memory device 100 may perform the erase operation ERS by using a gate induced drain leakage (GIDL) manner That is, an erase voltage may be applied to the common source line CSL of the nonvolatile memory device 100. In this case, when the dummy bit line DBL adjacent to the common source line CSL may be maintained at or supplied with the 0-th voltage V0, a time taken for the common source line CSL to increase to an erase voltage may be delayed.

The dummy bit line driver 160 may turn off the first switch SW1 in response to the first dummy bit line driving signal DBL_DRV1 from the control logic circuit 150. In this case, during the erase operation ERS of the nonvolatile memory device 100, the dummy bit line DBL may be in a floating state, and thus, a time taken for the common source line CSL to increase to an erase voltage may be shortened.

Figure 10A:
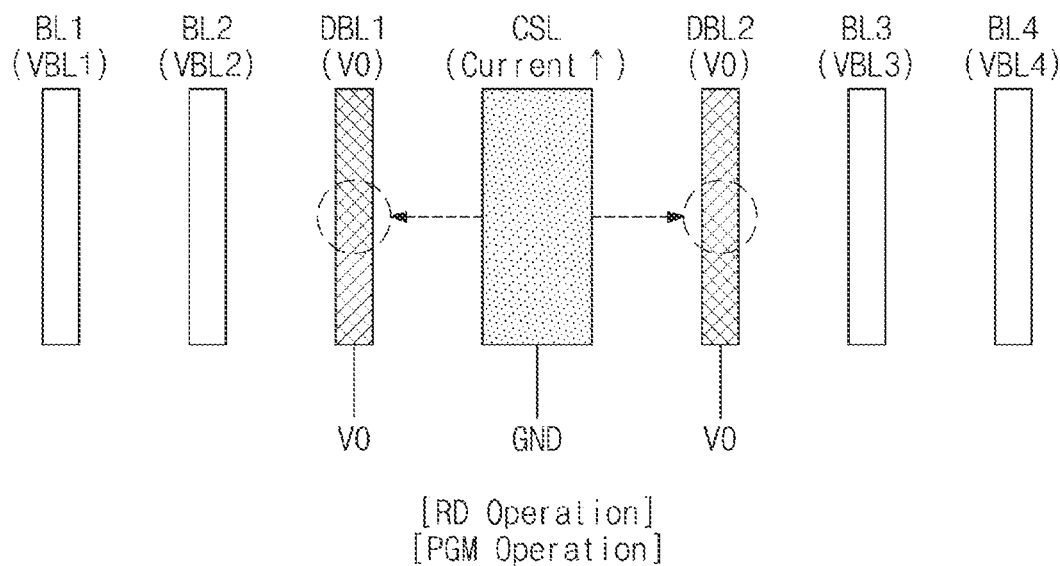
FIGS. 10A to 10C are diagrams for describing levels of bit lines, dummy bit lines, and the common source line CSL according to the timing diagram of FIG. 9.
Figure 10B:
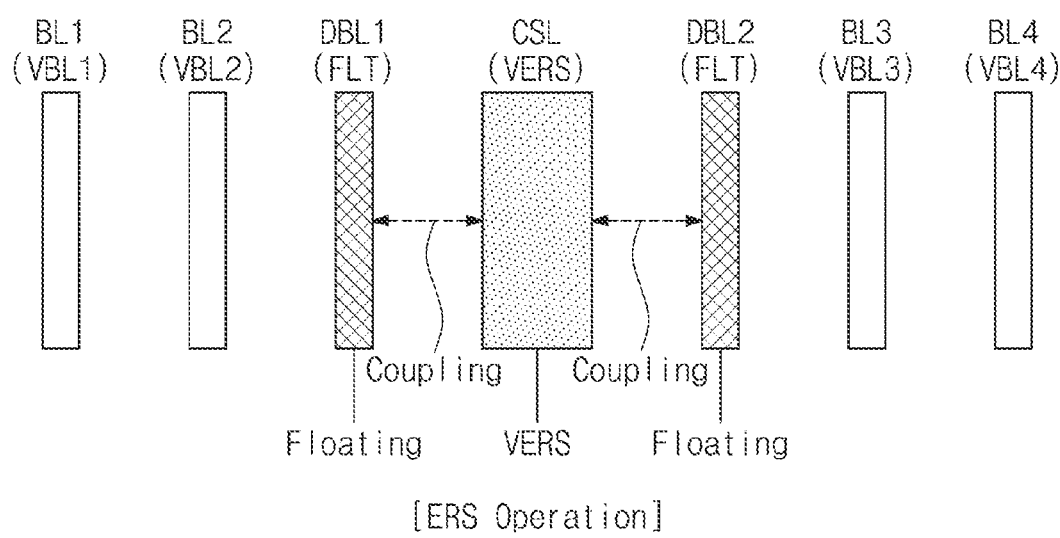
Figure 10C:
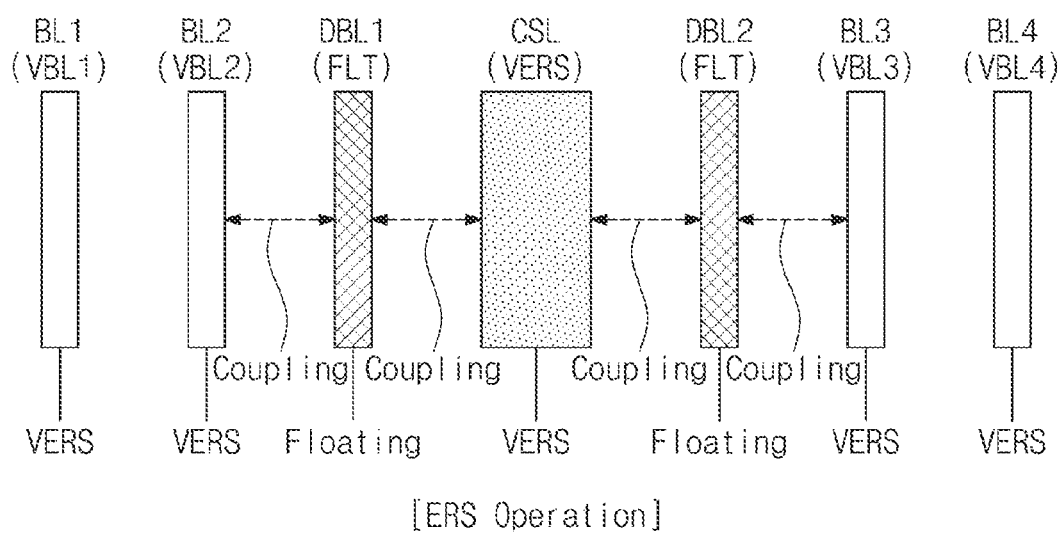

FIGS. 10A to 10C are diagrams for describing levels of bit lines, dummy bit lines, and the common source line CSL according to the timing diagram of FIG. 9. For convenience of description, some of various lines included in the cell core region CAR of the metal layer ML are illustrated in FIGS. 10A to 10C. It is assumed that dummy bit lines controlled by the dummy bit line driver 160 are a first dummy bit line DBL1 and a second dummy bit line DBL2, which are adjacent to the common source line CSL. However, the present disclosure is not limited thereto. The number and locations of dummy bit lines or the number and locations of dummy bit lines controlled by the dummy bit line driver 160 may be variously changed or modified.

First, referring to FIGS. 9 and 10A, when the nonvolatile memory device 100 performs the read operation RD or the program operation PGM (in particular, the program verification operation), first to fourth bit lines BL1, BL2, BL3, and BL4 may have first to fourth bit line voltages VBL1, VBL2, VBL3, and VBL4 depending on states of the corresponding memory cells.

When the nonvolatile memory device 100 performs the read operation RD or the program operation PGM (in particular, the program verification operation), the ground voltage GND may be applied to the common source line CSL and a current may flow to the common source line CSL depending on a state of a memory cell targeted for the read operation RD or the program operation PGM (in particular, the program verification operation). Noise due to a current flowing through the common source line CSL may affect adjacent bit lines (e.g., BL2 and BL3). In this case, the dummy bit line driver 160 according to the present disclosure may apply the 0-th voltage V0 to the first and second dummy bit lines DBL1 and DBL2. That is, the first and second dummy bit lines DBL1 and DBL2 may maintain the 0-th voltage V0 by the dummy bit line driver 160. In an embodiment, the 0-th voltage V0 may be provided from a power source or a voltage terminal, which is physically separated from the common source line CSL. The 0-th voltage V0 may be the ground voltage GND or VSS. Alternatively, the 0-th voltage V0 may be a predetermined positive voltage or a predetermined negative voltage.

As the 0-th voltage V0 is supplied to the first and second dummy bit lines DBL1 and DBL2, noise caused by a current of the common source line CSL may be prevented from being introduced into the adjacent bit lines (e.g., BL2 and BL3). That is, because the adjacent bit lines (e.g., BL2 and BL3) are not affected by the noise due to the current of the common source line CSL, states of memory cells connected with the adjacent bit lines (e.g., BL2 and BL3) or data stored therein may be accurately sensed.

Next, referring to FIGS. 9 and 10B, while the nonvolatile memory device 100 performs the erase operation ERS, an erase voltage VERS may be applied to the common source line CSL. The erase voltage VERS may be a positive high voltage. In the case where the first and second dummy bit lines DBL1 and DBL2 maintain the 0-th voltage V0 or any other bias voltage while the erase voltage VERS is applied to the common source line CSL, a time taken for the common source line CSL to increase to the erase voltage VERS may increase.

While the nonvolatile memory device 100 performs the erase operation ERS, the dummy bit line driver 160 according to an embodiment of the present disclosure may float the first and second dummy bit lines DBL1 and DBL2 adjacent to the common source line CSL. In this case, as the coupling is made between the common source line CSL and the first and second dummy bit lines DBL1 and DBL2 adjacent thereto while a level of the common source line CSL increases to the erase voltage VERS, a time taken for the common source line CSL to reach the erase voltage VERS may be shortened.

Then, referring to FIGS. 9 and 10C, while the nonvolatile memory device 100 performs the erase operation ERS, the dummy bit line driver 160 may float the first and second dummy bit lines DBL1 and DBL2 adjacent to the common source line CSL and the bit lines BL2 and BL3. For example, during the erase operation ERS, the nonvolatile memory device 100 may apply the erase voltage VERS to the common source line CSL and the bit lines BL1 to BL4. That is, unlike the embodiment of FIG. 10B, the nonvolatile memory device 100 may further apply the erase voltage VERS to the bit lines BL1 to BL4. That is, the dummy bit line driver 160 may shorten a time, which is necessary for the lines CSL, BL2, and BL3 to reach the erase voltage VERS, by floating the first and second dummy bit lines DBL1 and DBL2 adjacent to the common source line CSL and the bit lines BL2 and BL3.

An embodiment where one dummy bit line DBL1 is present between the common source line CSL and the bit line BL2 is illustrated in FIG. 10C, but the present disclosure is not limited thereto. For example, as described with reference to FIG. 6, the plurality of dummy bit lines DBLa may be present between the common source line CSL and the bit lines BLa. In this case, the dummy bit line driver 160 may be configured to float at least one dummy bit line being the most closely adjacent to the common source line CSL from among the dummy bit lines DBLa and at least one dummy bit line being the most closely adjacent to the bit lines BLa from among the dummy bit lines DBLa.

As described above, according to embodiments of the present disclosure, the dummy bit line driver 160 may be configured to apply the 0-th voltage V0 to at least one dummy bit line adjacent to the common source line CSL and may be configured to float the at least one dummy bit line adjacent to the common source line CSL during the erase operation ERS of the nonvolatile memory device 100. As such, noise caused by a current of the common source line CSL during a sensing operation (e.g., a read operation or a program verification operation) of the nonvolatile memory device 100 is not introduced into bit lines, and thus, the reliability of the sensing operation is improved. Also, during the erase operation ERS of the nonvolatile memory device 100, a time taken for the common source line CSL or the bit lines BL to increase to the erase voltage VERS may be shortened. Accordingly, a nonvolatile memory device with improved reliability and improved performance is provided.

Figure 11A:
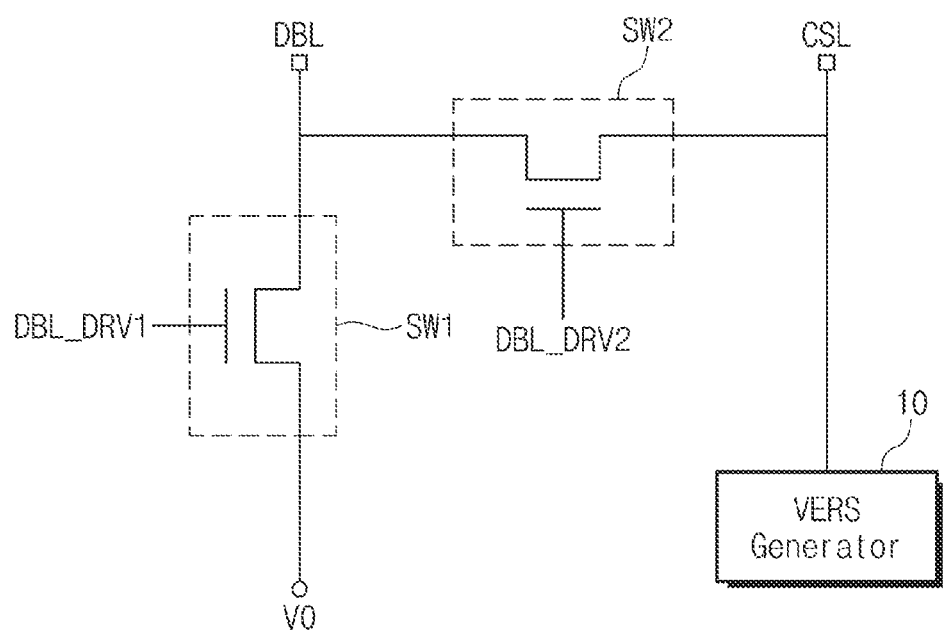
FIGS. 11A and 11B are diagrams illustrating a dummy bit line driver of FIG. 1.
Figure 11B:
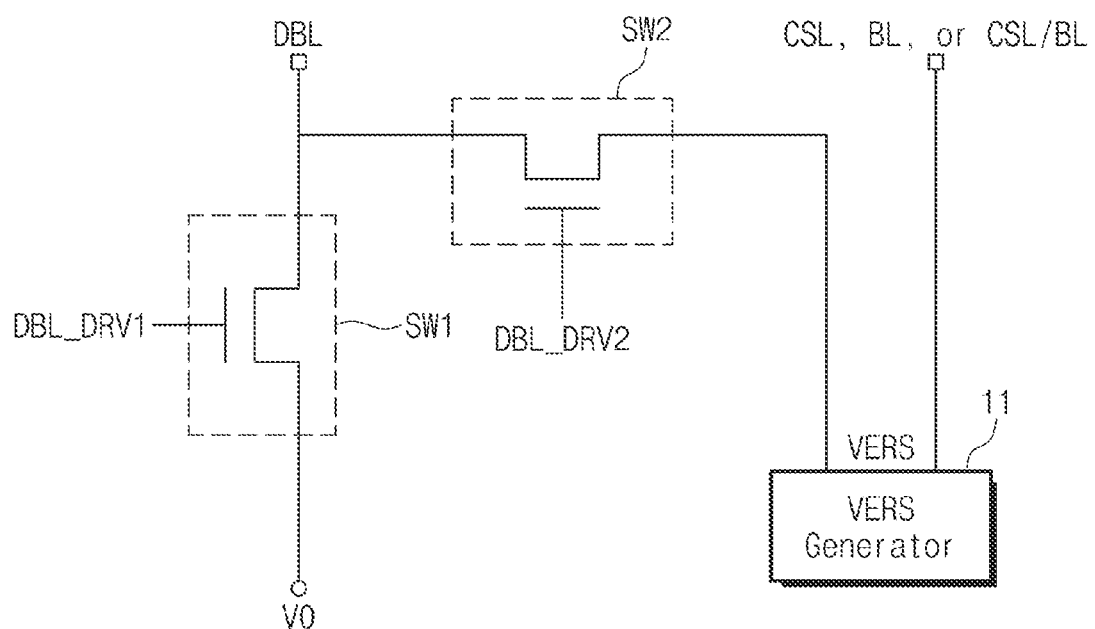

FIGS. 11A and 11B are diagrams illustrating a dummy bit line driver of FIG. 1. The dummy bit line driver 160 of FIG. 1 may be replaced with dummy bit line drivers 160a and 160b of FIGS. 11A and 11B.

Referring to FIGS. 1 and 11A, the dummy bit line driver 160a may include a first switch SW1 and a second switch SW2. The first switch SW1 may be connected between the dummy bit line DBL and the 0-th voltage V0 and may operate in response to a first dummy bit line driving signal DBL_DRV1. The first switch SW1 and the first dummy bit line driving signal DBL_DRV1 are similar to those described above, and thus, additional description will be omitted to avoid redundancy.

The second switch SW2 may be connected between the common source line CSL and the dummy bit line DBL and may operate in response to a second dummy bit line driving signal DBL_DRV2. For example, in the erase operation ERS of the nonvolatile memory device 100, the common source line CSL may be supplied with the erase voltage VERS from an erase voltage generator 10. In an embodiment, the erase voltage generator 10 may be included in the control logic and voltage generating circuit 150 of FIG. 1 or may be replaced with the control logic and voltage generating circuit 150 of FIG. 1.

During the erase operation ERS of the nonvolatile memory device 100, the second switch SW2 of the dummy bit line driver 160a may electrically connect the common source line CSL and the dummy bit line DBL in response to the second dummy bit line driving signal DBL_DRV2. That is, during the erase operation ERS of the nonvolatile memory device 100, the erase voltage VERS may be applied to both the common source line CSL and the dummy bit line DBL by the second switch SW2 of the dummy bit line driver 160a. In this case, because the dummy bit line DBL and the common source line CSL simultaneously increase to the erase voltage VERS, a time taken for the common source line CSL to reach the erase voltage VERS may be shortened.

Next, referring to FIGS. 1 and 11B, the dummy bit line driver 160b may include the first switch SW1 and the second switch SW2. The first switch SW1 may be connected between the dummy bit line DBL and the 0-th voltage V0 and may operate in response to the first dummy bit line driving signal DBL_DRV1. The first switch SW1 and the first dummy bit line driving signal DBL_DRV1 are similar to those described above, and thus, additional description will be omitted to avoid redundancy.

The second switch SW2 of FIG. 11B may be connected between the dummy bit line DBL and an erase voltage generator 11 and may operate in response to the second dummy bit line driving signal DBL_DRV2. For example, during the erase operation ERS of the nonvolatile memory device 100, the erase voltage generator 11 may be configured to provide the erase voltage VERS to the common source line CSL, the bit lines BL, or both the common source line CSL and the bit lines BL. That is, during the erase operation ERS of the nonvolatile memory device 100, a time that is necessary for the common source line CSL, the bit lines BL, or both the common source line CSL and the bit lines BL to reach the erase voltage VERS may be shortened.

Figure 12:
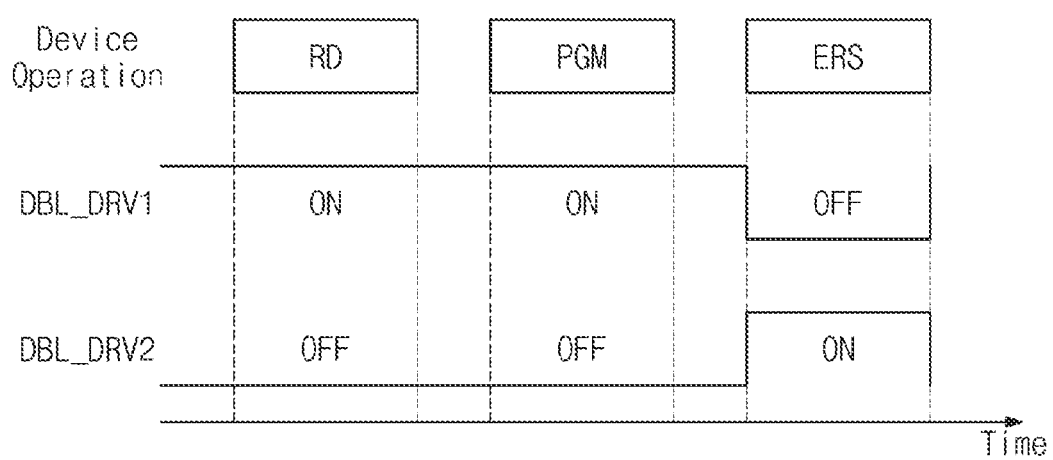
FIG. 12 is a timing diagram for describing first and second dummy bit line driving signals of FIG. 11A or 11B.

FIG. 12 is a timing diagram for describing first and second dummy bit line driving signals of FIG. 11A or 11B. For convenience of description, additional description associated with the components described above will be omitted to avoid redundancy. Referring to FIGS. 1, 11A, 11B, and 12, the control logic circuit 150 may generate the first and second dummy bit line driving signals DBL_DRV1 and DBL_DRV2 depending on an operation of the nonvolatile memory device 100.

For example, the control logic circuit 150 may generate the first dummy bit line driving signal DBL_DRV1 such that the first switch SW1 of the dummy bit line driver 160a or 160b is turned on during the read operation RD and the program operation PGM of the nonvolatile memory device 100 and the first switch SW1 of the dummy bit line driver 160a or 160b is turned off during the erase operation ERS of the nonvolatile memory device 100. The control logic circuit 150 may generate the second dummy bit line driving signal DBL_DRV2 such that the second switch SW2 of the dummy bit line driver 160a or 160b is turned off during the read operation RD and the program operation PGM of the nonvolatile memory device 100 and the second switch SW2 of the dummy bit line driver 160a or 160b is turned on during the erase operation ERS of the nonvolatile memory device 100.

How the dummy bit line driver 160a or 160b operates in response to the first and second dummy bit line driving signals DBL_DRV1 and DBL_DRV2 of the timing diagram of FIG. 12 is described above, and thus, additional description will be omitted to avoid redundancy.

Figure 13A:
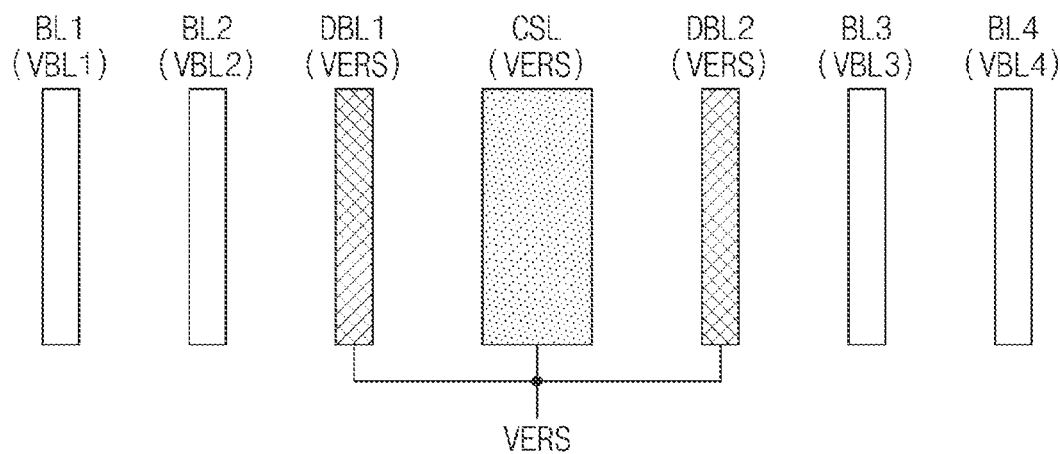
FIGS. 13A to 13C are diagrams for describing levels of bit lines, dummy bit lines, and a common source line according to the timing diagram of FIG. 12.
Figure 13B:
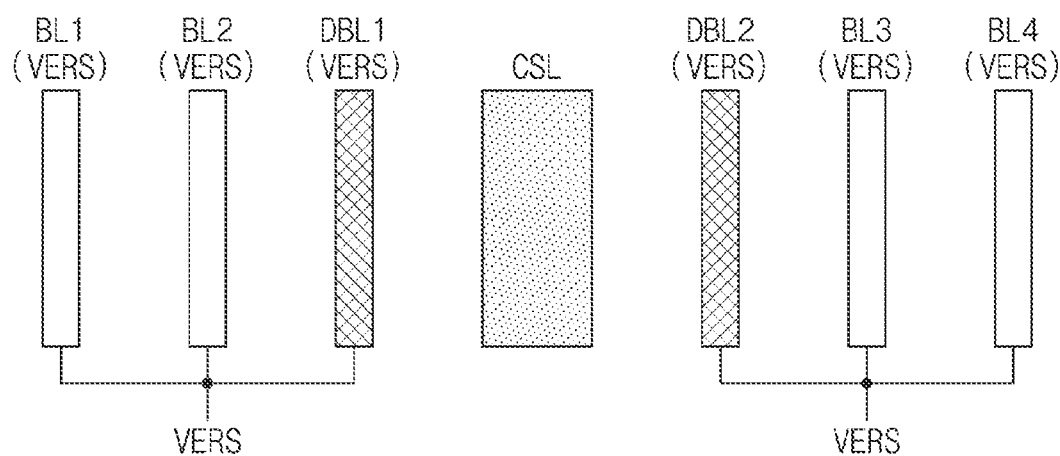
Figure 13C:
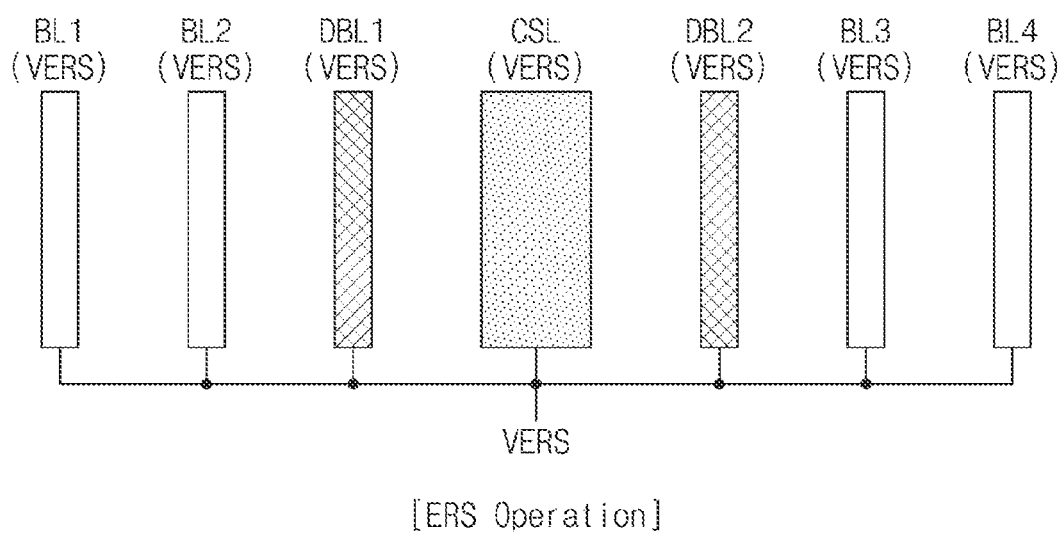

FIGS. 13A to 13C are diagrams for describing levels of bit lines, dummy bit lines, and a common source line according to the timing diagram of FIG. 12. For convenience of description, additional description associated with the components described above will be omitted to avoid redundancy. In an embodiment, levels of bit lines, dummy bit lines, and a common source line, which are set during the read operation RD or the program operation PGM of the nonvolatile memory device 100, are similar to those described with reference to FIG. 10A, and thus, additional description will be omitted to avoid redundancy.

Referring to FIGS. 1 and 13A, during the erase operation ERS of the nonvolatile memory device 100, the erase voltage VERS may be applied to both the common source line CSL and the dummy bit lines DBL1 and DBL2. In this case, because the dummy bit lines DBL1 and DBL2 adjacent to the common source line CSL increase to the erase voltage VERS, a time taken for the common source line CSL to reach the erase voltage VERS may be shortened. In an embodiment, the way to apply the erase voltage VERS to the dummy bit lines DBL1 and DBL2 of the nonvolatile memory device 100 may be accomplished by electrically connecting the dummy bit lines DBL1 and DBL2 and the common source line CSL through the second switch SW2 as illustrated in FIG. 11A or by providing the erase voltage VERS from the erase voltage generator 11 to the dummy bit lines DBL1 and DBL2 through the second switch SW2 as illustrated in FIG. 11B.

Referring to FIGS. 1 and 13B, during the erase operation ERS of the nonvolatile memory device 100, the erase voltage VERS may be applied to both the bit lines BL1 to BL4 and the dummy bit lines DBL1 and DBL2. In this case, because the dummy bit lines DBL1 and DBL2 adjacent to the bit lines BL2 and BL3 increase to the erase voltage VERS, a time taken for the bit lines BL2 and BL3 to reach the erase voltage VERS may be shortened. In an embodiment, the way to apply the erase voltage VERS to the dummy bit lines DBL1 and DBL2 of the nonvolatile memory device 100 may be accomplished by providing the erase voltage VERS from the erase voltage generator 11 to the dummy bit lines DBL1 and DBL2 through the second switch SW2 as illustrated in FIG. 11B.

Referring to FIGS. 1 and 13C, during the erase operation ERS of the nonvolatile memory device 100, the erase voltage VERS may be simultaneously applied to the common source line CSL, the bit lines BL1 to BL4, and the dummy bit lines DBL1 and DBL2. In this case, because the dummy bit lines DBL1 and DBL2 adjacent to the common source line CSL and the bit lines BL2 and BL3 increase to the erase voltage VERS, a time taken for the common source line CSL and the bit lines BL2 and BL3 to reach the erase voltage VERS may be shortened. In an embodiment, the way to apply the erase voltage VERS to the dummy bit lines DBL1 and DBL2 of the nonvolatile memory device 100 may be accomplished by electrically connecting the dummy bit lines DBL1 and DBL2 and the common source line CSL through the second switch SW2 as illustrated in FIG. 11A or by providing the erase voltage VERS from the erase voltage generator 11 to the dummy bit lines DBL1 and DBL2 through the second switch SW2 as illustrated in FIG. 11B.

Figure 14:
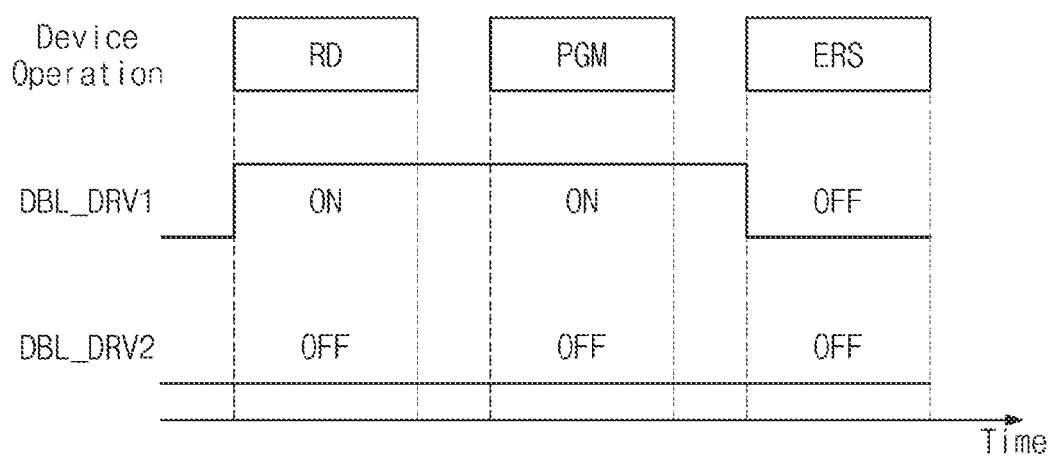
FIG. 14 is a timing diagram for describing first and second dummy bit line driving signals of FIG. 11A or 11B.

FIG. 14 is a timing diagram for describing first and second dummy bit line driving signals of FIG. 11A or 11B. For convenience of description, additional description associated with the components described above will be omitted to avoid redundancy. Referring to FIGS. 1, 11A, 11B, and 14, the control logic circuit 150 may generate the first and second dummy bit line driving signals DBL_DRV1 and DBL_DRV2 depending on an operation of the nonvolatile memory device 100.

For example, in the read operation RD and the program operation PGM of the nonvolatile memory device 100, as described with reference to FIG. 12, the control logic circuit 150 may generated the first dummy bit line driving signal DBL_DRV1. The control logic circuit 150 may generate the second dummy bit line driving signal DBL_DRV2 such that the second switch SW2 of the dummy bit line driver 160a or 160b is turned off. According to the timing diagram of FIG. 14, the dummy bit line driver 160a or 160b may operate as described with reference to FIGS. 8 to 10B, and thus, additional description will be omitted to avoid redundancy.

In an embodiment, a dummy bit line driver may be implemented as illustrated in FIG. 11A. However, in the case where the nonvolatile memory device 100 performs an erase operation by applying the erase operation ERS to the bit lines BL, the control logic circuit 150 may generate the first and second dummy bit line driving signals DBL_DRV1 and DBL_DRV2 like the timing diagram of FIG. 14 such that the dummy bit lines DBL are floated during the erase operation. As such, a time taken for the bit lines BL to increase to the erase voltage VERS may be shortened.

Figure 15A:
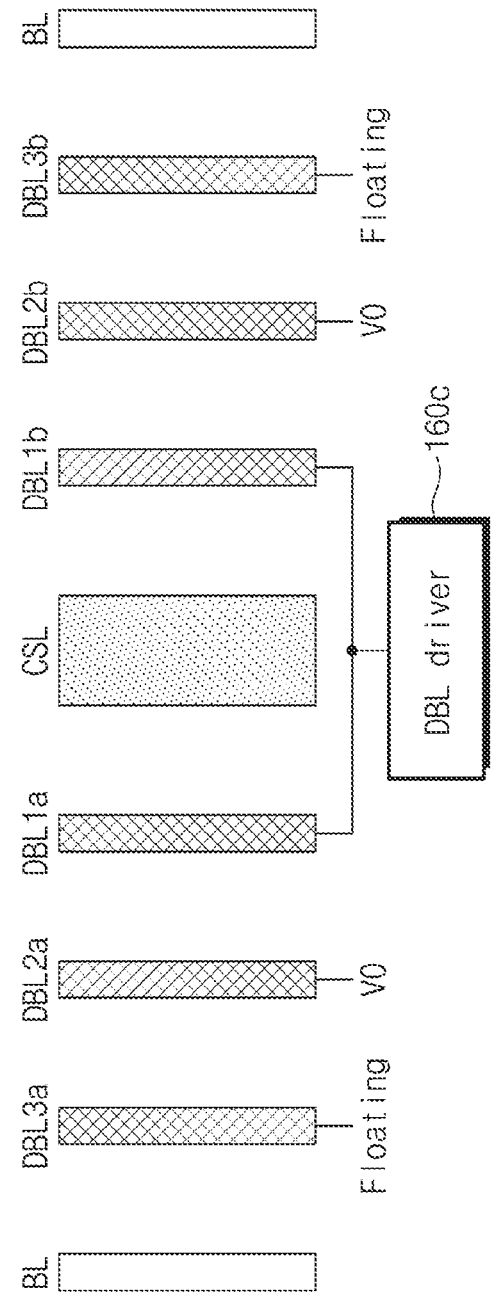
FIGS. 15A and 15B are diagrams for describing a method for controlling dummy bit lines.
Figure 15B:
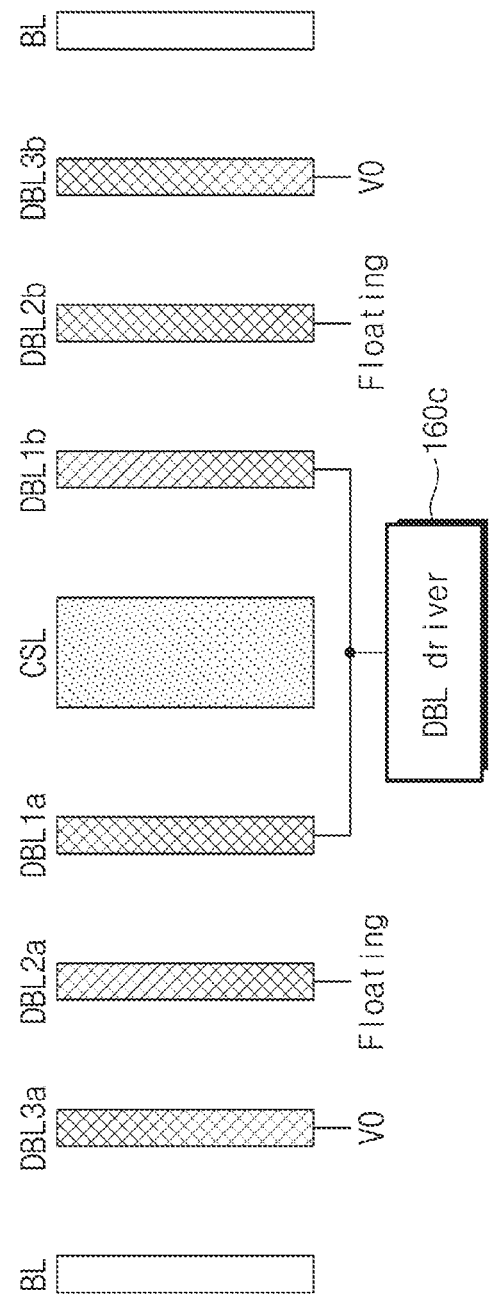

FIGS. 15A and 15B are diagrams for describing a method for controlling dummy bit lines. A configuration for controlling one dummy bit line DBL between the common source line CSL and the bit lines BL is described with reference to the above embodiments, but the present disclosure is not limited thereto.

For example, as illustrated in FIG. 15A, a plurality of dummy bit lines DBL1a, DBL2a, DBL3a, DBL1b, DBL2b, and DBL3b may be present between the bit lines BL and the common source line CSL. In this case, a dummy bit line driver 160c may control first dummy bit lines DBL1a and DBL1b adjacent to the common source line CSL from among the plurality of dummy bit lines DBL1a, DBL2a, DBL3a, DBL1b, DBL2b, and DBL3b, based on the driving scheme described above. Second dummy bit lines DBL2a and DBL2b of the plurality of dummy bit lines DBL1a, DBL2a, DBL3a, DBL1b, DBL2b, and DBL3b may be supplied with the 0-th voltage V0 or a given voltage, and third dummy bit lines DBL3a and DBL3b thereof may be floated. In this case, the second dummy bit lines DBL2a and DBL2b and the third dummy bit lines DBL3a and DBL3b may maintain a bias state or a floating state regardless of an operation of the nonvolatile memory device 100.

In an embodiment, a location of dummy bit lines that are set to the 0-th voltage V0 or the floating state may be variously changed or modified. For example, as illustrated in FIG. 15B, the second dummy bit lines DBL2a and DBL2b may be floated, and the 0-th voltage V0 or a given voltage may be applied to the third dummy bit lines DBL3a and DBL3b.

The embodiments of FIGS. 15A and 15B are simple examples, and the present disclosure is not limited thereto. For example, locations of dummy bit lines to be controlled by the dummy bit line driver 160 or locations of dummy bit lines to be set to a given state may be variously changed or modified depending on an operation of the nonvolatile memory device 100.

Figure 16:
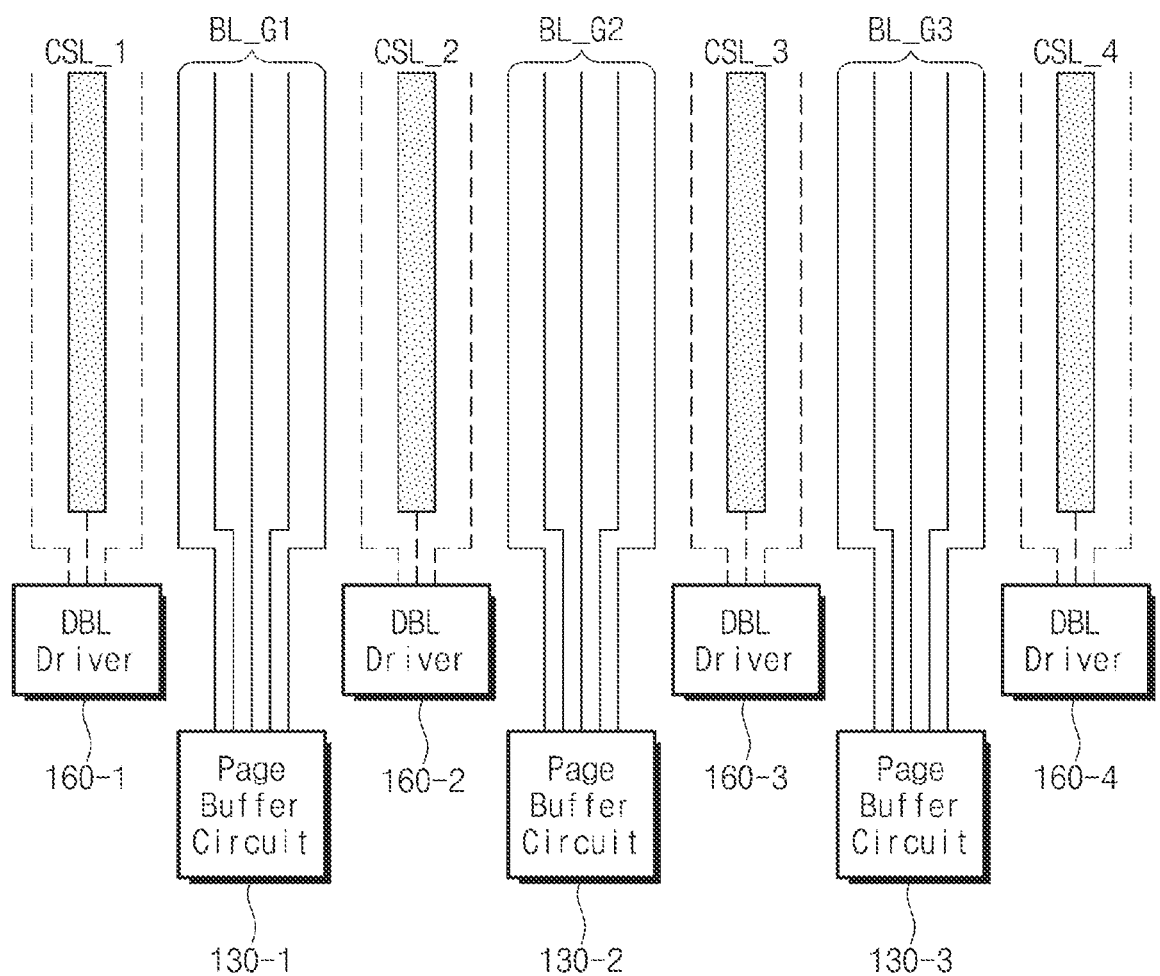
FIG. 16 is a diagram illustrating an embodiment in which a nonvolatile memory device includes a plurality of dummy bit line drivers.

FIG. 16 is a diagram illustrating an embodiment in which a nonvolatile memory device includes a plurality of dummy bit line drivers. For brevity of drawing and for convenience of description, unnecessary components are omitted. For brevity of drawing, in FIG. 16, a dummy bit line is expressed by a dotted line.

Referring to FIGS. 1 and 16, each of first to third bit line groups BL_G1 to BL_G3 may include a plurality of bit lines, and the first to third bit line groups BL_G1 to BL_G3 may be respectively connected with first to third page buffer circuits 130-1 to 130-3. An equal number of bit lines may be included in the first to third bit line groups BL_G1 to BL_G3, but the present disclosure is not limited thereto.

The first to third bit line groups BL_G1 to BL_G3 may be distinguishable by common source lines CSL. For example, the first bit line group BL_G1 may be interposed between first and second common source lines CSL_1 and CSL_2, the second bit line group BL_G2 may be interposed between second and third common source lines CSL_2 and CSL_3, and the third bit line group BL_G3 may be interposed between third and fourth common source lines CSL_3 and CSL_4. In the embodiment of FIG. 16, the first to fourth common source lines CSL_1 to CSL_4 are illustrated as being separated from each other, but the present disclosure is not limited thereto. For example, the first to fourth common source lines CSL_1 to CSL_4 may be connected in a mesh structure or a ring structure to form one common source line CSL.

A plurality of dummy bit line drivers 160-1 to 160-4 may be connected with dummy bit lines adjacent to the common source lines CSL_1 to CSL_4 or may control the dummy bit lines. For example, the first dummy bit line driver 160-1 may be configured to control dummy bit lines adjacent to the first common source line CSL_1, the second dummy bit line driver 160-2 may be configured to control dummy bit lines adjacent to the second common source line CSL_2, the third dummy bit line driver 160-3 may be configured to control dummy bit lines adjacent to the third common source line CSL_3, and the fourth dummy bit line driver 160-4 may be configured to control dummy bit lines adjacent to the fourth common source line CSL_4.

The plurality of dummy bit line drivers 160-1 to 160-4 may independently operate depending on an operating state of the nonvolatile memory device 100 and operating states of the bit line groups BL_G1 to BL_G3. For example, when a read operation is performed on the second bit line group BL_G2, the second and third dummy bit line drivers 160-2 and 160-3 that respectively correspond to the second and third common source lines CSL_2 and CSL_3 adjacent to the second bit line group BL_G2 may operate based on the operating scheme described above. In an embodiment, the remaining dummy bit line drivers 160-1 and 160-4 may be disabled, may drive the corresponding dummy bit lines with a specific voltage, or may float the corresponding dummy bit lines.

Figure 17:
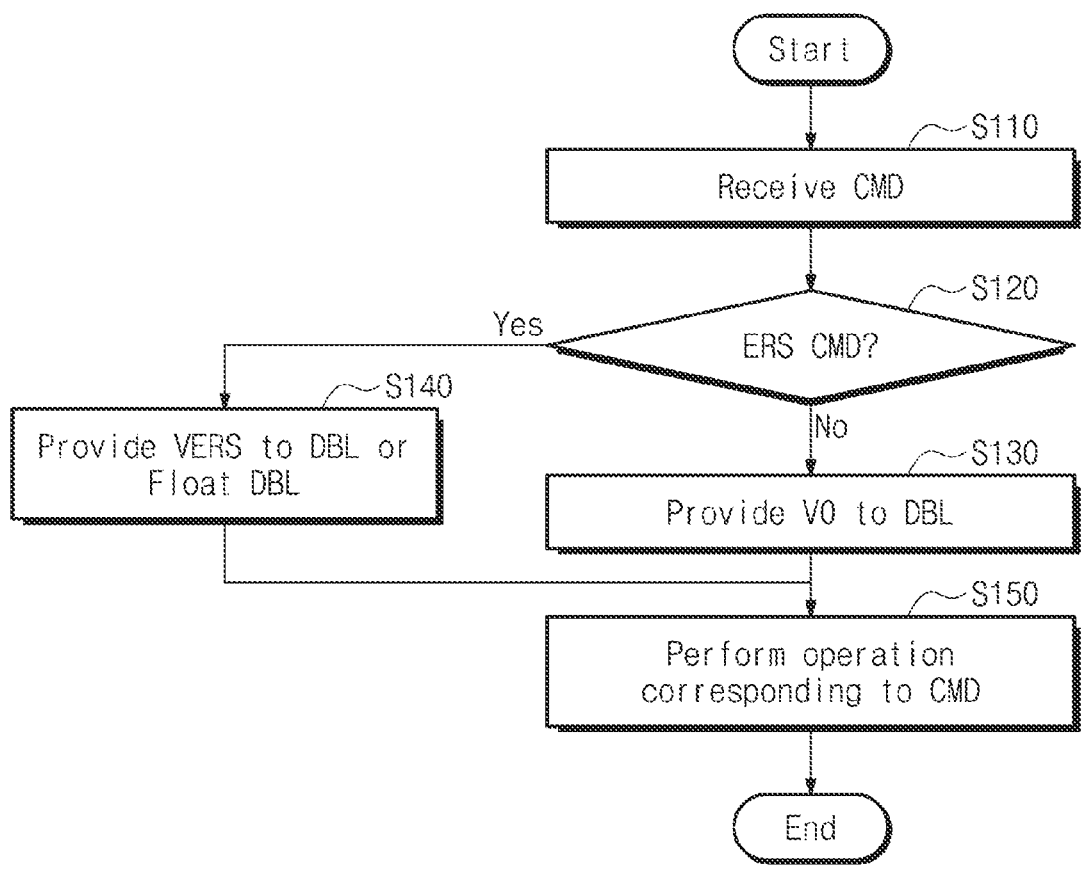
FIG. 17 is a flowchart illustrating an operation of a nonvolatile memory device of FIG. 1.

FIG. 17 is a flowchart illustrating an operation of a nonvolatile memory device of FIG. 1. Referring to FIGS. 1 and 17, in operation S110, the nonvolatile memory device 100 may receive the command CMD. For example, the nonvolatile memory device 100 may receive the command CMD from an external device (e.g., a memory controller).

In operation S120, the nonvolatile memory device 100 may determine whether the received command CMD is an erase command ERS CMD. When the received command CMD is not the erase command ERS CMD, in operation S130, the nonvolatile memory device 100 may provide the 0-th voltage V0 to the dummy bit line DBL. For example, in response to the command CMD, the control logic circuit 150 of the nonvolatile memory device 100 may generate the first dummy bit line driving signal DBL_DRV1 or the second dummy bit line driving signal DBL_DRV2 such that the 0-th voltage V0 is provided to the dummy bit line DBL. In an embodiment, the control logic circuit 150 may maintain the first dummy bit line driving signal DBL_DRV1 or the second dummy bit line driving signal DBL_DRV2 such that the 0-th voltage V0 is provided to the dummy bit line DBL.

The dummy bit line driver (i.e., 160, 160a, 160b, or at least one of 160-1 to 160-4) may provide the 0-th voltage V0 to the dummy bit line DBL in response to the first dummy bit line driving signal DBL_DRV1 or the second dummy bit line driving signal DBL_DRV2.

When the received command CMD is the erase command ERS CMD, in operation S140, the nonvolatile memory device 100 may apply the erase voltage VERS to the dummy bit line DBL or may float the dummy bit line DBL. For example, in response to the command CMD, the control logic circuit 150 may generate the first dummy bit line driving signal DBL_DRV1 or the second dummy bit line driving signal DBL_DRV2 such that the erase voltage VERS is provided to the dummy bit line DBL or the dummy bit line DBL is floated. In response to the first dummy bit line driving signal DBL_DRV1 or the second dummy bit line driving signal DBL_DRV2, the dummy bit line driver (i.e., 160, 160a, 160b, or at least one of 160-1 to 160-4) may provide the erase voltage VERS to the dummy bit line DBL or may float the dummy bit line DBL. In an embodiment, in response to the first dummy bit line driving signal DBL_DRV1 or the second dummy bit line driving signal DBL_DRV2, the dummy bit line driver (i.e., 160a or at least one of 160-1 to 160-4) may electrically connect the dummy bit line DBL with the common source line CSL.

In operation S150, the nonvolatile memory device 100 may perform an operation corresponding to the command CMD. For example, when the command CMD is a read command, the nonvolatile memory device 100 may perform a read operation. In this case, because the 0-th voltage V0 is supplied to the dummy bit line DBL in operation S130, noise caused by a current of the common source line CSL is not introduced into bit lines. When the command CMD is an erase command, the nonvolatile memory device 100 may perform an erase operation. In this case, as described in operation S140, because the erase voltage VERS is applied to the dummy bit line DBL or the dummy bit line DBL is floated, a speed at which the common source line CSL or the bit lines BL reach the erase voltage VERS may be improved.

Figure 18A:
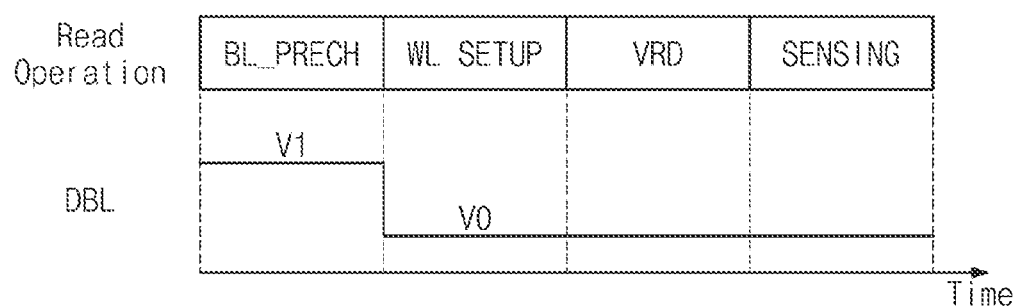
FIGS. 18A and 18B are timing diagrams for describing an operation of a nonvolatile memory device according to an embodiment of the present disclosure.
Figure 18B:
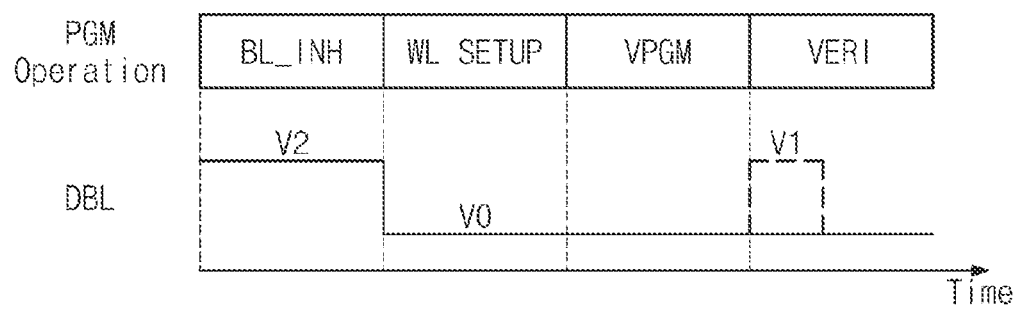

FIGS. 18A and 18B are timing diagrams for describing an operation of a nonvolatile memory device according to an embodiment of the present disclosure. For brevity of drawing and for convenience of description, a read operation and a program operation of the nonvolatile memory device 100 are schematically illustrated. However, the present disclosure is not limited thereto. In FIGS. 18A and 18B, a horizontal axis denotes time.

In the embodiments described above, when the nonvolatile memory device 100 does not perform an erase operation (i.e., the nonvolatile memory device 100 performs the read operation or the program operation), the dummy bit lines DBL maintains the 0-th voltage V0. However, the present disclosure is not limited thereto. For example, while the nonvolatile memory device 100 performs the read operation or the program operation, a voltage of the dummy bit line DBL may be variously controlled.

For example, referring to FIGS. 1 and 18A, the nonvolatile memory device 100 may perform the read operation. The read operation may include a bit line precharge operation BL_PRECH, a word line setup operation WL_SETUP, a selection read voltage applying operation VRD, and a sensing operation SENSING.

As illustrated in FIG. 18A, in the read operation of the nonvolatile memory device 100, a first voltage V1 may be applied to the dummy bit lines DBL during the bit line precharge operation BL_PRECH and the 0-th voltage V0 may be applied to the dummy bit lines DBL during the remaining operations WL_SETUP, VRD, and SENSING. As the first voltage V1 is applied to the dummy bit lines DBL during the bit line precharge operation BL_PRECH, a speed at which the bit lines BL are precharged may be improved.

For example, the bit line precharge operation BL_PRECH of the bit lines BL is an operation of charging the bit lines BL with a precharge voltage. In the case where the dummy bit line DBL maintains the 0-th voltage V0 during the bit line precharge operation BL_PRECH, a speed at which the bit line BL adjacent to the dummy bit line DBL is precharged may be decreased. On the other hand, during the bit line precharge operation BL_PRECH of the bit lines BL, when the first voltage V1 is applied to the dummy bit lines DBL, a speed at which the bit line BL adjacent to the dummy bit line DBL is precharged may be improved. In an embodiment, the first voltage V1 may be provided to the dummy bit line DBL with the same level as the bit line precharge voltage or in the same form as the bit line precharge voltage.

In an embodiment, during the sensing operation SENSING of the read operation, the voltage of the dummy bit lines DBL may maintain the 0-th voltage V0. In this case, as described above, noise that is caused by a current flowing to the common source line CSL may be prevented from being introduced into the bit lines BL.

Next, referring to FIGS. 1 and 18B, the nonvolatile memory device 100 may perform the program operation. The program operation may include a bit line inhibiting operation BL_INH, a word line setup operation WL_SETUP, a program voltage applying operation VPGM, and a verification operation VERI. In an embodiment, the verification operation VERI may be similar to the read operation described above. That is, the verification operation VERI may include a plurality of sub-operations as described with reference to FIG. 18A, and the first voltage V1 may be provided to the dummy bit lines DBL during one sub-operation (e.g., the bit line precharge operation) of the plurality of sub-operations.

As illustrated in FIG. 18B, in the program operation of the nonvolatile memory device 100, a second voltage V2 may be applied to the dummy bit lines DBL during the bit line inhibiting operation BL_INH and the 0-th voltage V0 may be applied to the dummy bit lines DBL during the remaining operations WL_SETUP, VPGM, and VERI. As the second voltage V2 is applied to the dummy bit lines DBL during the bit line inhibiting operation BL_INH, a speed at which the bit lines BL are precharged may be improved. For example, the bit line inhibiting operation BL_INH may indicate an operation of charging bit lines corresponding to program-inhibited memory cells with a power supply voltage VCC. In this case, as in the above description, as the second voltage V2 is provided to the dummy bit lines DBL, bit lines adjacent to the dummy bit lines DBL may be quickly charged to the power supply voltage VCC.

In an embodiment, the timing diagrams illustrated in FIGS. 18A and 18B are an example, but the present disclosure is not limited thereto. The nonvolatile memory device 100 according to an embodiment of the present disclosure may control the dummy bit lines DBL through any other methods as well as the methods of controlling the dummy bit lines DBL, which are illustrated in FIGS. 18A and 18B.

For example, the read operation may include a plurality of read sub-operations. In at least one first read sub-operation of the plurality of read sub-operations, the nonvolatile memory device 100 may provide the first voltage V1 to the dummy bit lines DBL. In this case, the at least one first read sub-operation may include a bit line precharge operation (i.e., an operation of directly controlling a voltage of a bit line). In at least one second read sub-operation of the plurality of read sub-operations, the nonvolatile memory device 100 may provide the 0-th voltage V0 to the dummy bit lines DBL. The at least one second read sub-operation may include a sensing operation (i.e., an operation in which a noise may be caused by a current of a common source line).

Likewise, the program operation may include a plurality of program sub-operations; in at least one first program sub-operation of the plurality of program sub-operations, the nonvolatile memory device 100 may provide the second voltage V2 to the dummy bit lines DBL. In this case, the at least one first program sub-operation may include a bit line inhibiting operation (i.e., an operation of directly controlling a voltage of a bit line). In at least one second program sub-operation of the plurality of program sub-operations, the nonvolatile memory device 100 may provide the 0-th voltage V0 to the dummy bit lines DBL. In this case, the at least one second program sub-operation may include a verification operation or a bit line precharge operation included in the verification operation.

As described above, the nonvolatile memory device 100 according to an embodiment of the present disclosure may maintain a voltage of the dummy bit lines DBL at the 0-th voltage V0 during the program operation or the read operation, and thus, noise that is caused by a current flowing through the common source line CSL may be prevented from being introduced into the bit lines BL. In an embodiment, in the program operation or the read operation, during a sub-operation in which a voltage of the bit line BL is directly controlled or an operation in which the bit lines BL are charged to a specific voltage (e.g., a precharge voltage or a power supply voltage), the nonvolatile memory device 100 may set a voltage of the dummy bit lines DBL to a given voltage (e.g., V1 or V2). In this case, because a time taken to charge bit lines with a specific voltage is shortened, the performance of the nonvolatile memory device 100 may be improved.

Figure 19:
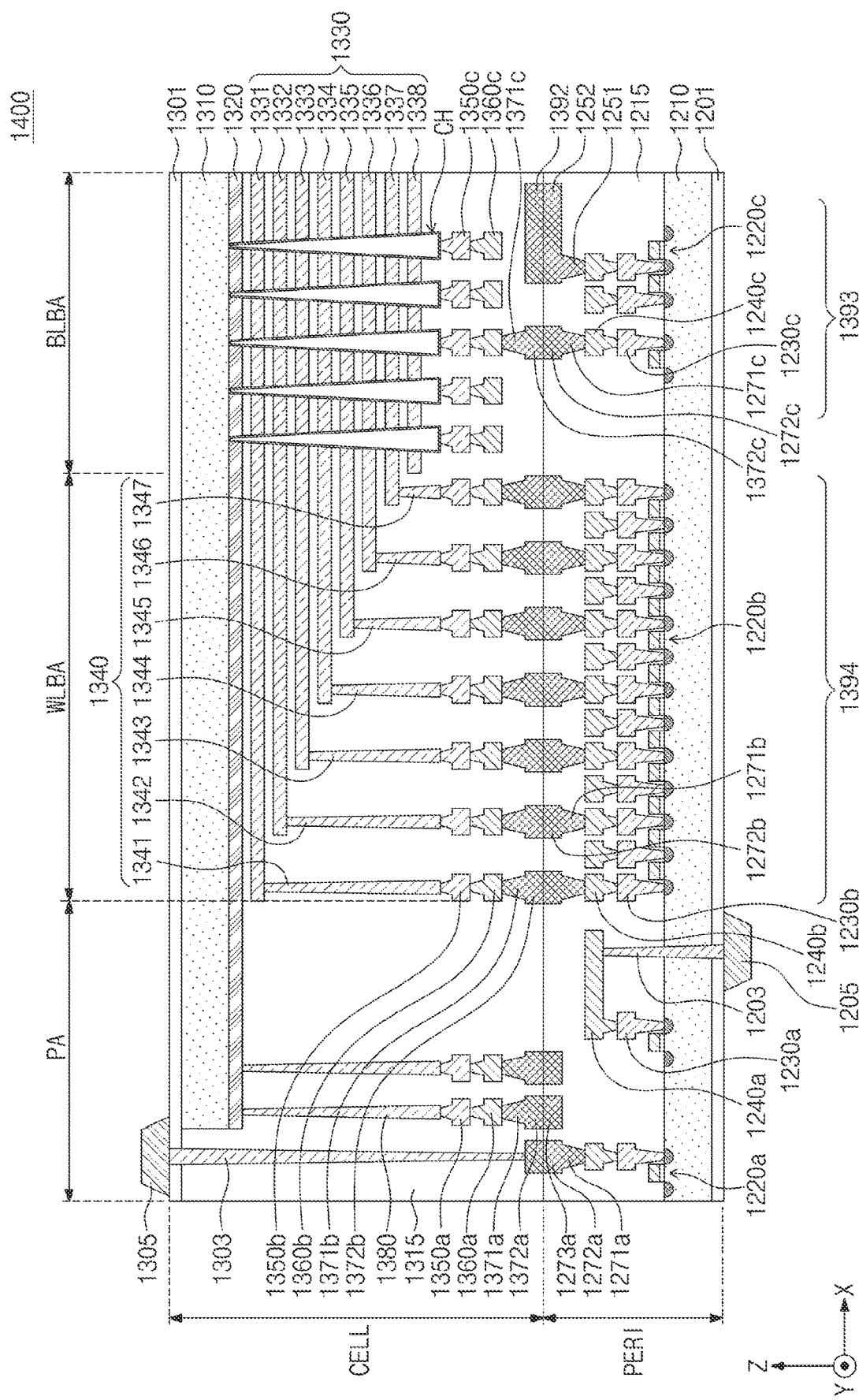
FIG. 19 is a diagram illustrating a memory device according to the present disclosure.

FIG. 19 is a diagram illustrating a memory device 1400 according to another example embodiment. Referring to FIG. 19, a memory device 1400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on a lowermost metal layer of the upper chip and a bonding metal formed on an uppermost metal layer of the lower chip. For example, the bonding metals may include copper (Cu) using a Cu–Cu bonding. The example embodiment, however, may not be limited thereto. For example, the bonding metals may also be formed of aluminum (Al) or tungsten (W).

Each of the peripheral circuit region PERI and the cell region CELL of the memory device 1400 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, and 1230c respectively connected to the plurality of circuit elements 1220a, 1220b, and 1220c, and second metal layers 1240a, 1240b, and 1240c formed on the first metal layers 1230a, 1230b, and 1230c. In an example embodiment, the first metal layers 1230a, 1230b, and 1230c may be formed of tungsten having a relatively high electrical resistance and the second metal layers 1240*a*, 1240*b*, and 1240*c* may be formed of copper having relatively a low electrical resistance.

In an example embodiment illustrate in FIG. 19, although only the first metal layers 1230*a*, 1230*b*, and 1230*c* and the second metal layers 1240*a*, 1240*b*, and 1240*c* are shown and described; the example embodiment is not limited thereto, and one or more additional metal layers may be further formed on the second metal layers 1240*a*, 1240*b*, and 1240*c*. At least a portion of the one or more additional metal layers formed on the second metal layers 1240*a*, 1240*b*, and 1240*c* may be formed of aluminum or the like having a lower electrical resistance than those of copper forming the second metal layers 1240*a*, 1240*b*, and 1240*c*.

The interlayer insulating layer 1215 may be disposed on the first substrate 1210 and cover the plurality of circuit elements 1220*a*, 1220*b*, and 1220*c*, the first metal layers 1230*a*, 1230*b*, and 1230*c*, and the second metal layers 1240*a*, 1240*b*, and 1240*c*. The interlayer insulating layer 1215 may include an insulating material such as silicon oxide, silicon nitride, or the like.

Lower bonding metals 1271*b* and 1272*b* may be formed on the second metal layer 1240*b* in the word line bonding area WLBA. In the word line bonding area WLBA, the lower bonding metals 1271*b* and 1272*b* in the peripheral circuit region PERI may be electrically bonded to upper bonding metals 1371*b* and 1372*b* of the cell region CELL. The lower bonding metals 1271*b* and 1272*b* and the upper bonding metals 1371*b* and 1372*b* may be formed of aluminum, copper, tungsten, or the like.

Further, the upper bonding metals 1371*b* and 1372*b* in the cell region CELL may be referred to as first metal pads and the lower bonding metals 1271*b* and 1272*b* in the peripheral circuit region PERI may be referred to as second metal pads.

The cell region CELL may include at least one memory block. The cell region CELL may include a second substrate 1310, an interlayer insulating layer 1315 and a common source line 1320. On the second substrate 1310, a plurality of word lines 1331 to 1338 (i.e., 1330) may be stacked in a direction (a Z-axis direction) perpendicular to an upper surface of the second substrate 1310. At least one string select line and at least one ground select line may be arranged on and below the plurality of word lines 1330, respectively, and the plurality of word lines 1330 may be disposed between the at least one string select line and the at least one ground select line.

Widths of the plurality of word lines 1330 along the X-direction may be different each other. As a distance from the first substrate 1210 of the peripheral circuit region PERI to respective one of the plurality of word line 1330 increases, the width of the respective one of the plurality of word line 1330 decreases. Similarly, as a distance from the second substrate 1310 of the cell region CELL to respective one of the plurality of word line 1330 increases, the width of the respective one of the plurality of word line 1330 increases.

In the bit line bonding area BLBA, a channel structure CH may extend in a direction (a Z-axis direction) perpendicular to the upper surface of the second substrate 1310 and pass through the plurality of word lines 1330, the at least one string select line, and the at least one ground select line. The channel structure CH may include a data storage layer, a channel layer, a buried insulating layer and the like, and the channel layer may be electrically connected to a first metal layer 1350*c* and a second metal layer 1360*c*. For example, the first metal layer 1350*c* may be a bit line contact and the second metal layer 1360*c* may be a bit line. In an example embodiment, the bit line 1360*c* may extend in a first direction (a Y-axis direction) parallel to the upper surface of the second substrate 1310.

The interlayer insulating layer 1315 may be disposed on the second substrate 1310 and cover the common source line 1320, the plurality of word lines 1330, the plurality of cell contact plugs 1340, the first metal layer 1350*a*, 1350*b* and 1350*c*, and the second metal layer 1360*a*, 1360*b* and 1360*c*. The interlayer insulating layer 1315 may include an insulating material such as silicon oxide, silicon nitride, or the like.

In an example embodiment illustrated in FIG. 19, an area in which the channel structure CH, the bit line 1360*c*, and the like are disposed may be defined as the bit line bonding area BLBA. In the bit line bonding area BLBA, the bit line 1360*c* may be electrically connected to the circuit elements 1220*c* providing a page buffer 1393 in the peripheral circuit region PERI. The bit line 1360*c* may be connected to upper bonding metals 1371*c* and 1372*c* in the cell region CELL, and the upper bonding metals 1371*c* and 1372*c* may be connected to lower bonding metals 1271*c* and 1272*c* connected to the circuit elements 1220*c* of the page buffer 1393.

In the word line bonding area WLBA, the plurality of word lines 1330 may extend in a second direction (an X-axis direction) parallel to the upper surface of the second substrate 1310 and perpendicular to the first direction and may be connected to a plurality of cell contact plugs 1341 to 1347 (i.e., 1340). The plurality of word lines 1330 and the plurality of cell contact plugs 1340 may be connected to each other in pads provided by at least a portion of the plurality of word lines 1330 extending in different lengths in the second direction. A first metal layer 1350*b* and a second metal layer 1360*b* may be connected to an upper portion of the plurality of cell contact plugs 1340 connected to the plurality of word lines 1330, sequentially. The plurality of cell contact plugs 1340 may be connected to the peripheral circuit region PERI by the upper bonding metals 1371*b* and 1372*b* of the cell region CELL and the lower bonding metals 1271*b* and 1272*b* of the peripheral circuit region PERI in the word line bonding area WLBA.

The plurality of cell contact plugs 1340 may be electrically connected to the circuit elements 1220*b* forming a row decoder 1394 in the peripheral circuit region PERI. In an example embodiment, operating voltages of the circuit elements 1220*b* of the row decoder 1394 may be different than operating voltages of the circuit elements 1220*c* forming the page buffer 1393. For example, operating voltages of the circuit elements 1220*c* forming the page buffer 1393 may be greater than operating voltages of the circuit elements 1220*b* forming the row decoder 1394.

A common source line contact plug 1380 may be disposed in the external pad bonding area PA. The common source line contact plug 1380 may be formed of a conductive material such as a metal, a metal compound, polysilicon, or the like and may be electrically connected to the common source line 1320. A first metal layer 1350*a* and a second metal layer 1360*a* may be stacked on a lower portion of the common source line contact plug 1380, sequentially. For example, an area in which the common source line contact plug 1380, the first metal layer 1350*a*, and the second metal layer 1360*a* are disposed may be defined as the external pad bonding area PA.

Input-output pads 1205 and 1305 may be disposed in the external pad bonding area PA. Referring to FIG. 19, a lower insulating film 1201 covering a lower surface of the first substrate 1210 may be formed below the first substrate 1210 and a first input-output pad 1205 may be formed on the lower insulating film 1201. The first input-output pad 1205 may be connected to at least one of the plurality of circuit elements 1220a, 1220b, and 1220c disposed in the peripheral circuit region PERI through a first input-output contact plug 1203 and may be separated from the first substrate 1210 by the lower insulating film 1201. In addition, a side insulating film may be disposed between the first input-output contact plug 1203 and the first substrate 1210 to electrically separate the first input-output contact plug 1203 and the first substrate 1210.

Referring to FIG. 19, an upper insulating film 1301 covering the upper surface of the second substrate 1310 may be formed on the second substrate 1310 and a second input-output pad 1305 may be disposed on the upper insulating layer 1301. The second input-output pad 1305 may be connected to at least one of the plurality of circuit elements 1220a, 1220b, and 1220c disposed in the peripheral circuit region PERI through a second input-output contact plug 1303. In the example embodiment, the second input-output pad 1305 is electrically connected to a circuit element 1220a.

According to embodiments, the second substrate 1310 and the common source line 1320 may not be disposed in an area in which the second input-output contact plug 1303 is disposed. Also, the second input-output pad 1305 may not overlap the word lines 1330 in the third direction (the Z-axis direction). Referring to FIG. 19, the second input-output contact plug 1303 may be separated from the second substrate 1310 in a direction parallel to the upper surface of the second substrate 1310 and may pass through the interlayer insulating layer 1315 of the cell region CELL to be connected to the second input-output pad 1305 and the lower bonding metals 1271a and 1272a of the peripheral circuit area PERI.

According to embodiments, the first input-output pad 1205 and the second input-output pad 1305 may be selectively formed. For example, the memory device 1400 may include only the first input-output pad 1205 disposed on the first substrate 1210 or the second input-output pad 1305 disposed on the second substrate 1310. Alternatively, the memory device 1400 may include both the first input-output pad 1205 and the second input-output pad 1305.

A metal pattern provided on a lowermost metal layer may be provided as a dummy pattern or the lowermost metal layer may be absent in each of the external pad bonding area PA and the bit line bonding area BLBA respectively included in the cell region CELL and the peripheral circuit region PERI.

In the external pad bonding area PA, the memory device 1400 may include a lower metal pattern 1273a, corresponding to an upper metal pattern 1372a formed in a lowermost metal layer of the cell region CELL and having the same cross-sectional shape as the upper metal pattern 1372a of the cell region CELL, so as to be connected to each other in an uppermost metal layer of the peripheral circuit region PERI. In the peripheral circuit region PERI, the lower metal pattern 1273a formed in the uppermost metal layer of the peripheral circuit region PERI may not be connected to a contact. Similarly, in the external pad bonding area PA, an upper metal pattern 1372a, corresponding to the lower metal pattern 1273a formed in an uppermost metal layer of the peripheral circuit region PERI and having the same shape as a lower metal pattern 1273a of the peripheral circuit region PERI, may be formed in a lowermost metal layer of the cell region CELL.

The lower bonding metals 1271b and 1272b may be formed on the second metal layer 1240b in the word line bonding area WLBA. In the word line bonding area WLBA, the lower bonding metals 1271b and 1272b of the peripheral circuit region PERI may be electrically connected to the upper bonding metals 1371b and 1372b of the cell region CELL by a Cu-to-Cu bonding.

Further, in the bit line bonding area BLBA, an upper metal pattern 1392, corresponding to a lower metal pattern 1252 formed in the uppermost metal layer of the peripheral circuit region PERI and having the same cross-sectional shape as the lower metal pattern 1252 of the peripheral circuit region PERI, may be formed in a lowermost metal layer of the cell region CELL. A contact may not be formed on the upper metal pattern 1392 formed in the lowermost metal layer of the cell region CELL.

In an example embodiment, corresponding to a metal pattern formed in a lowermost metal layer in one of the cell region CELL and the peripheral circuit region PERI, a reinforcement metal pattern having the same cross-sectional shape as the metal pattern may be formed in a lowermost metal layer in another one of the cell region CELL and the peripheral circuit region PERI. A contact may not be formed on the reinforcement metal pattern.

In an embodiment, the memory device 1400 described with reference to FIG. 19 may include the nonvolatile memory device 100 described with reference to FIGS. 1 to 17. The cell region CELL and the peripheral circuit region PERI of the nonvolatile memory device 100 described with reference to FIGS. 1 to 17 may correspond to the cell region CELL and the peripheral circuit region PERI of the memory device 1400 described with reference to FIG. 19. A bonding pad for the dummy bit lines may be also included in the bit line bonding area BLBA of FIG. 19, and the dummy bit lines may be electrically connected to the dummy bit line driver of the peripheral circuit area PERI through the added bonding pads. The dummy bit line driver of the peripheral circuit area PERI may control the dummy bit lines based on the method described with reference to FIGS. 1 to 19. In an embodiment, the dummy bit line driver may be formed in the peripheral circuit area PERI to be physically separated from the page buffer 1393.

Figure 20:
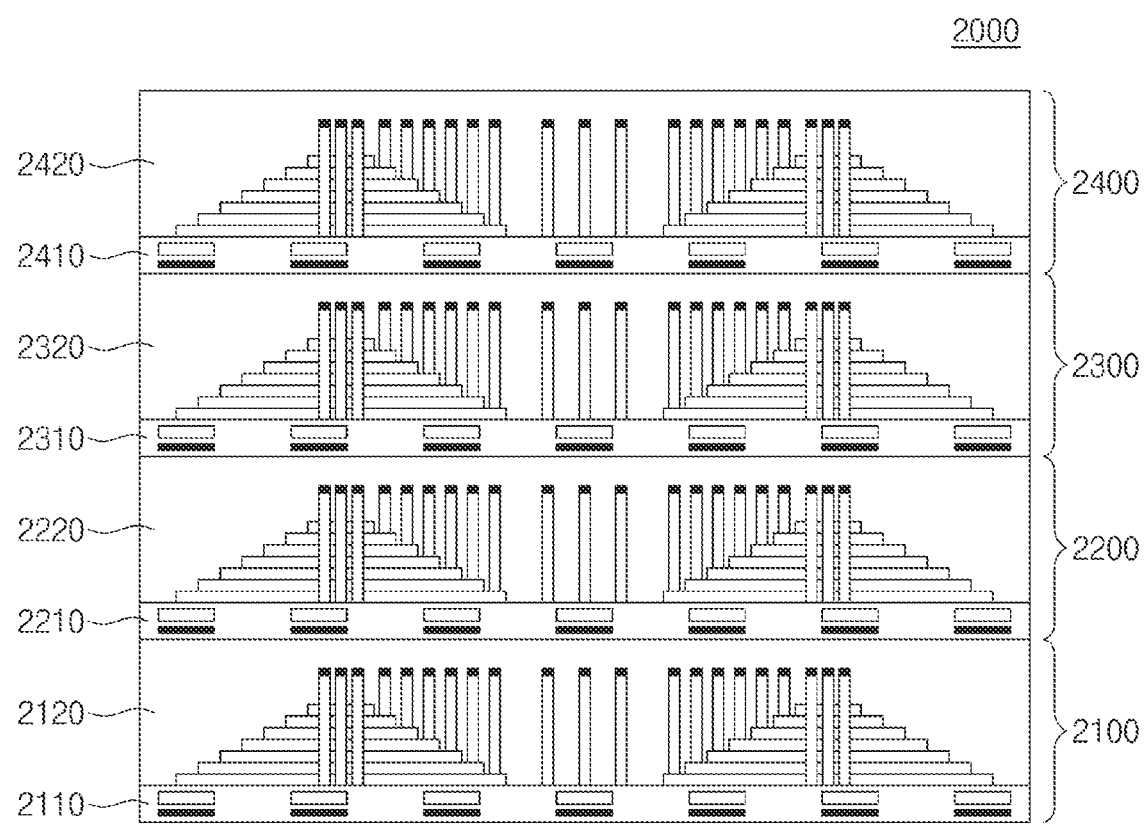
FIGS. 20 to 22 are diagrams for describing various stacked structures of a nonvolatile memory module according to the present disclosure.
Figure 21:
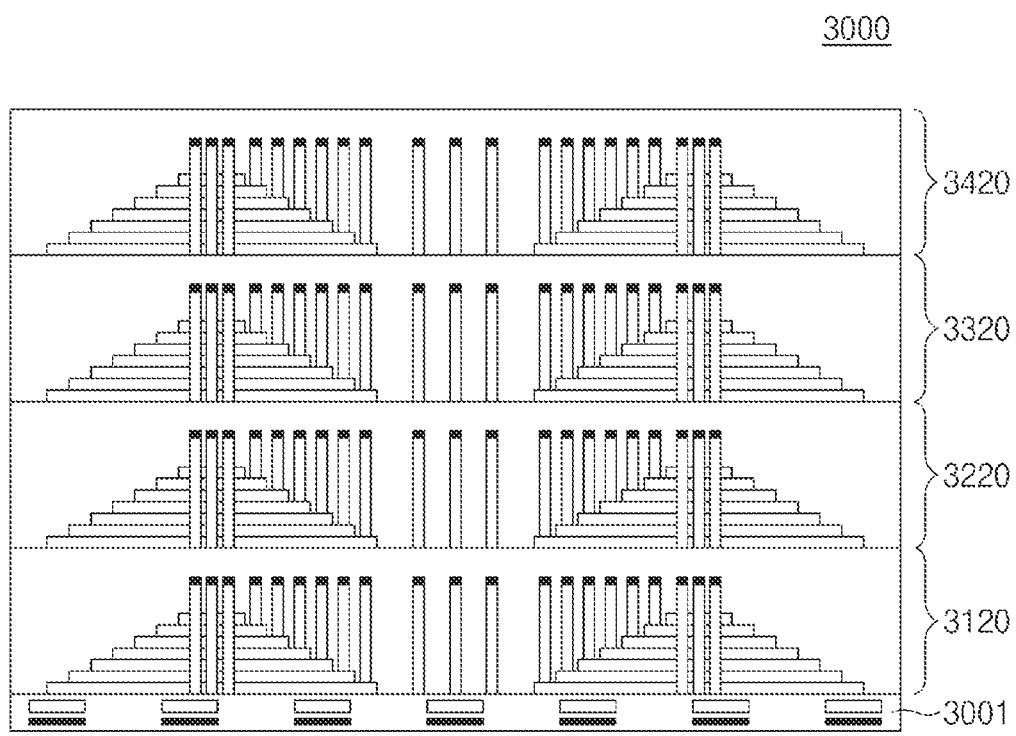
Figure 22:
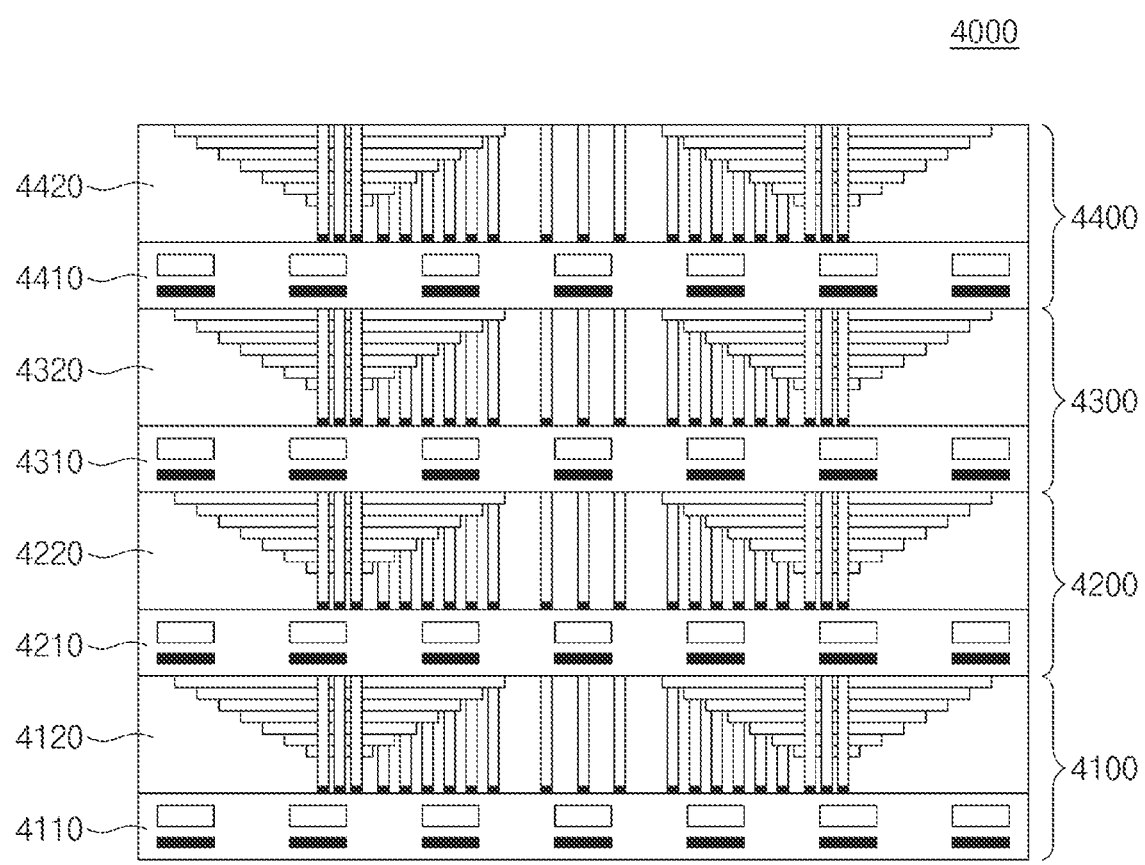

FIGS. 20 to 22 are diagrams for describing various stacked structures of a nonvolatile memory module according to the present disclosure. In an embodiment, various memory structures to be described with reference to FIGS. 20 to 22 may be the nonvolatile memory device described with reference to FIGS. 1 to 19 or may operate based on the method described with reference to FIGS. 1 to 19. The number of memory structures to be described with reference to FIGS. 20 to 22 is an example, and the number of memory structures may be variously changed or modified.

Referring to FIG. 20, a memory device 2000 may include a plurality of memory structures 2100 to 2400. The plurality of memory structures 2100 to 2400 may be stacked in a direction perpendicular to a substrate. For example, the first memory structure 2100 may be formed at a lower substrate (not illustrated) and the second memory structure 2200 may be formed on the first memory structure 2100. The third memory structure 2300 may be formed on the second memory structure 2200, and the fourth memory structure 2400 may be formed on the third memory structure 2300.

Each of the plurality of memory structures 2100 to 2400 may have a COP structure. For example, the first memory structure 2100 may include a first peripheral circuit 2110 and a first cell array 2120 formed on the first peripheral circuit 2110. Likewise, the second to fourth memory structures 2200 to 2400 may include second to fourth peripheral circuits 2210 to 2410, respectively; the second to fourth memory structures 2200 to 2400 may further include the second to fourth cell arrays 2220 to 2420 respectively formed on the second to fourth peripheral circuits 2210 to 2410, respectively.

In an embodiment, the first to fourth cell arrays 2120 to 2420 may include dummy bit lines and each dummy bit line may be connected with a dummy bit line driver of the corresponding peripheral circuit. For example, dummy bit lines of the first cell array 2120 may be connected with a dummy bit line driver of the first peripheral circuit 2110, dummy bit lines of the second cell array 2220 may be connected with a dummy bit line driver of the second peripheral circuit 2210, dummy bit lines of the third cell array 2320 may be connected with a dummy bit line driver of the third peripheral circuit 2310, and dummy bit lines of the fourth cell array 2420 may be connected with a dummy bit line driver of the fourth peripheral circuit 2410. The dummy bit line drivers may control the dummy bit lines based on the method described with reference to FIGS. 1 to 19.

Referring to FIG. 21, a memory device 3000 may include a peripheral circuit 3001 and a plurality of cell arrays 3120 to 3420. Compared to the memory device 2000 of FIG. 20, the memory device 3000 of FIG. 21 may not include peripheral circuits between the plurality of cell arrays 3120 to 3420. For example, the peripheral circuit 3001 may be formed on a lower substrate (not illustrated), the first cell array 3120 may be formed on the peripheral circuit 3001, the second cell array 3220 may be formed on the first cell array 3120, the third cell array 3320 may be formed on the second cell array 3220, and the fourth cell array 3420 may be formed on the third cell array 3320.

Each of the plurality of cell arrays 3120 to 3420 may include a metal layer for word lines, bit lines, or dummy bit lines. The dummy bit lines of each of the plurality of cell arrays 3120 to 3420 may be connected with a dummy bit line driver of the peripheral circuit 3001.

In an embodiment, channels of the plurality of cell arrays 3120 to 3420 may be shared to form one channel; in this case, in the plurality of cell arrays 3120 to 3420, cell strings sharing the same channel may constitute one memory block.

Referring to FIG. 22, a memory device 4000 may include a plurality of memory structures 4100 to 4400. The plurality of memory structures 4100 to 4400 may be stacked in a direction perpendicular to a substrate. Each of the plurality of memory structures 4100 to 4400 may include a peripheral circuit and a cell array bonded in the bonding manner, as described with reference to FIG. 19. For example, the first memory structure 4100 may include a first peripheral circuit 4110 and a first cell array 4120 formed on the first peripheral circuit 4110. In this case, the first peripheral circuit 4110 and the first cell array 4120 may be electrically interconnected through the bonding manner as described with reference to FIG. 19. Likewise, the second to fourth memory structures 4200 to 4400 may include second to fourth peripheral circuits 4210 to 4410, respectively; the second to fourth memory structures 4200 to 4400 may further include second to fourth cell arrays 4220 to 4420 respectively bonded to the second to fourth peripheral circuits 4210 to 4410, respectively.

As described above, a nonvolatile memory device according to an embodiment of the present disclosure may have various stacked structures. The nonvolatile memory device may control dummy bit lines depending on an operation state thereof. Accordingly, a nonvolatile memory device with improved reliability and improved performance is provided.

Figure 23:
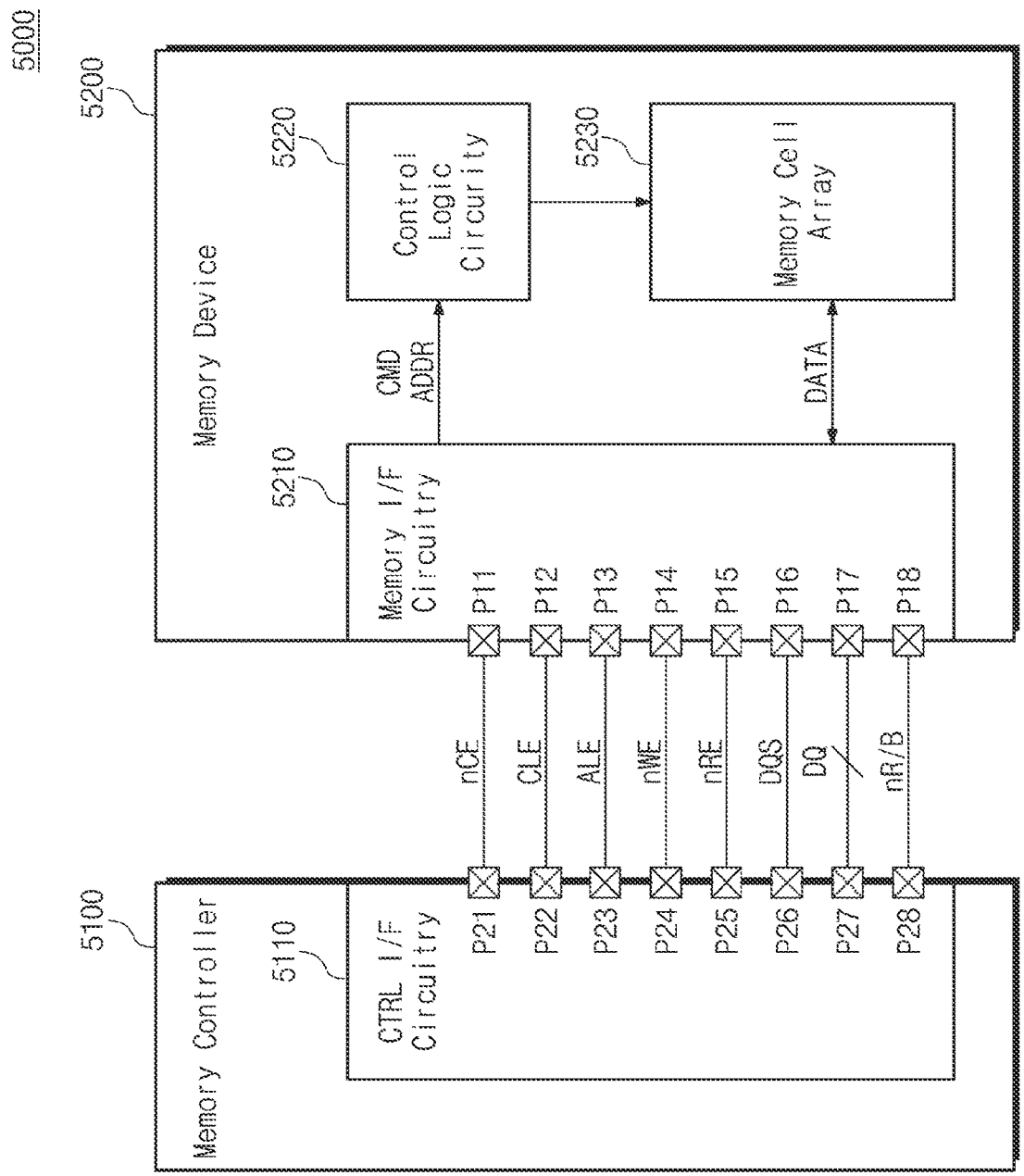
FIG. 23 is a block diagram illustrating a memory system according to an embodiment of the present disclosure.

FIG. 23 is a block diagram of a memory system 5000 according to an embodiment. Referring to FIG. 23, the memory system 5000 may include a memory device 5200 and a memory controller 5100. The memory device 5200 may include first to eighth pins P11 to P18, a memory interface circuitry 5210, a control logic circuitry 5220, and a memory cell array 5230. The memory device 5200 may be the nonvolatile memory device described with reference to FIGS. 1 to 22.

The memory interface circuitry 5210 may receive a chip enable signal nCE from the memory controller 5100 through the first pin P11. The memory interface circuitry 5210 may transmit and receive signals to and from the memory controller 5100 through the second to eighth pins P12 to P18 in response to the chip enable signal nCE. For example, when the chip enable signal nCE is in an enable state (e.g., a low level), the memory interface circuitry 5210 may transmit and receive signals to and from the memory controller 5100 through the second to eighth pins P12 to P18.

The memory interface circuitry 5210 may receive a command latch enable signal CLE, an address latch enable signal ALE, and a write enable signal nWE from the memory controller 5100 through the second to fourth pins P12 to P14. The memory interface circuitry 5210 may receive a data signal DQ from the memory controller 5100 through the seventh pin P17 or transmit the data signal DQ to the memory controller 5100. A command CMD, an address ADDR, and data may be transmitted via the data signal DQ. For example, the data signal DQ may be transmitted through a plurality of data signal lines. In this case, the seventh pin P17 may include a plurality of pins respectively corresponding to a plurality of data signals DQ(s).

The memory interface circuitry 5210 may obtain the command CMD from the data signal DQ, which is received in an enable section (e.g., a high-level state) of the command latch enable signal CLE based on toggle time points of the write enable signal nWE. The memory interface circuitry 5210 may obtain the address ADDR from the data signal DQ, which is received in an enable section (e.g., a high-level state) of the address latch enable signal ALE based on the toggle time points of the write enable signal nWE.

In an example embodiment, the write enable signal nWE may be maintained at a static state (e.g., a high level or a low level) and toggle between the high level and the low level. For example, the write enable signal nWE may toggle in a section in which the command CMD or the address ADDR is transmitted. Thus, the memory interface circuitry 5210 may obtain the command CMD or the address ADDR based on toggle time points of the write enable signal nWE.

The memory interface circuitry 5210 may receive a read enable signal nRE from the memory controller 5100 through the fifth pin P15. The memory interface circuitry 5210 may receive a data strobe signal DQS from the memory controller 5100 through the sixth pin P16 or transmit the data strobe signal DQS to the memory controller 5100.

In a data (DATA) output operation of the memory device 300, the memory interface circuitry 5210 may receive the read enable signal nRE, which toggles through the fifth pin P15, before outputting the data DATA. The memory interface circuitry 5210 may generate the data strobe signal DQS, which toggles based on the toggling of the read enable signal nRE. For example, the memory interface circuitry 5210 may generate a data strobe signal DQS, which starts toggling after a predetermined delay (e.g., tDQSRE), based on a toggling start time of the read enable signal nRE. The memory interface circuitry 5210 may transmit the data signal DQ including the data DATA based on a toggle time point of the data strobe signal DQS. Thus, the data DATA may be aligned with the toggle time point of the data strobe signal DQS and transmitted to the memory controller 5100.

In a data (DATA) input operation of the memory device 300, when the data signal DQ including the data DATA is received from the memory controller 5100, the memory interface circuitry 5210 may receive the data strobe signal DQS, which toggles, along with the data DATA from the memory controller 5100. The memory interface circuitry 5210 may obtain the data DATA from the data signal DQ based on toggle time points of the data strobe signal DQS. For example, the memory interface circuitry 5210 may sample the data signal DQ at rising and falling edges of the data strobe signal DQS and obtain the data DATA.

The memory interface circuitry 5210 may transmit a ready/busy output signal nR/B to the memory controller 5100 through the eighth pin P18. The memory interface circuitry 5210 may transmit state information of the memory device 5200 through the ready/busy output signal nR/B to the memory controller 5100. When the memory device 5200 is in a busy state (i.e., when operations are being performed in the memory device 300), the memory interface circuitry 5210 may transmit a ready/busy output signal nR/B indicating the busy state to the memory controller 5100. When the memory device 5200 is in a ready state (i.e., when operations are not performed or completed in the memory device 300), the memory interface circuitry 5210 may transmit a ready/busy output signal nR/B indicating the ready state to the memory controller 5100. For example, while the memory device 5200 is reading data DATA from the memory cell array 5230 in response to a page read command, the memory interface circuitry 5210 may transmit a ready/busy output signal nR/B indicating a busy state (e.g., a low level) to the memory controller 5100. For example, while the memory device 5200 is programming data DATA to the memory cell array 5230 in response to a program command, the memory interface circuitry 5210 may transmit a ready/busy output signal nR/B indicating the busy state to the memory controller 5100.

The control logic circuitry 5220 may control all operations of the memory device 300. The control logic circuitry 5220 may receive the command/address CMD/ADDR obtained from the memory interface circuitry 5210. The control logic circuitry 5220 may generate control signals for controlling other components of the memory device 5200 in response to the received command/address CMD/ADDR. For example, the control logic circuitry 5220 may generate various control signals for programming data DATA to the memory cell array 5230 or reading the data DATA from the memory cell array 5230.

The memory cell array 5230 may store the data DATA obtained from the memory interface circuitry 5210, via the control of the control logic circuitry 5220. The memory cell array 5230 may output the stored data DATA to the memory interface circuitry 5210 via the control of the control logic circuitry 5220.

The memory cell array 5230 may include a plurality of memory cells. For example, the plurality of memory cells may be flash memory cells. However, the disclosure is not limited thereto, and the memory cells may be RRAM cells, FRAM cells, PRAM cells, thyristor RAM (TRAM) cells, or MRAM cells. Hereinafter, an embodiment in which the memory cells are NAND flash memory cells will mainly be described.

The memory controller 5100 may include first to eighth pins P21 to P28 and a controller interface circuitry 5110. The first to eighth pins P21 to P28 may respectively correspond to the first to eighth pins P11 to P18 of the memory device 5200.

The controller interface circuitry 5110 may transmit a chip enable signal nCE to the memory device 5200 through the first pin P21. The controller interface circuitry 5110 may transmit and receive signals to and from the memory device 300, which is selected by the chip enable signal nCE, through the second to eighth pins P22 to P28.

The controller interface circuitry 5110 may transmit the command latch enable signal CLE, the address latch enable signal ALE, and the write enable signal nWE to the memory device 5200 through the second to fourth pins P22 to P24. The controller interface circuitry 5110 may transmit or receive the data signal DQ to and from the memory device 5200 through the seventh pin P27.

The controller interface circuitry 5110 may transmit the data signal DQ including the command CMD or the address ADDR to the memory device 5200 along with the write enable signal nWE, which toggles. The controller interface circuitry 5110 may transmit the data signal DQ including the command CMD to the memory device 5200 by transmitting a command latch enable signal CLE having an enable state. Also, the controller interface circuitry 5110 may transmit the data signal DQ including the address ADDR to the memory device 5200 by transmitting an address latch enable signal ALE having an enable state.

The controller interface circuitry 5110 may transmit the read enable signal nRE to the memory device 5200 through the fifth pin P25. The controller interface circuitry 5110 may receive or transmit the data strobe signal DQS from or to the memory device 5200 through the sixth pin P26.

In a data (DATA) output operation of the memory device 300, the controller interface circuitry 5110 may generate a read enable signal nRE, which toggles, and transmit the read enable signal nRE to the memory device 300. For example, before outputting data DATA, the controller interface circuitry 5110 may generate a read enable signal nRE, which is changed from a static state (e.g., a high level or a low level) to a toggling state. Thus, the memory device 5200 may generate a data strobe signal DQS, which toggles, based on the read enable signal nRE. The controller interface circuitry 5110 may receive the data signal DQ including the data DATA along with the data strobe signal DQS, which toggles, from the memory device 300. The controller interface circuitry 5110 may obtain the data DATA from the data signal DQ based on a toggle time point of the data strobe signal DQS.

In a data (DATA) input operation of the memory device 300, the controller interface circuitry 5110 may generate a data strobe signal DQS, which toggles. For example, before transmitting data DATA, the controller interface circuitry 5110 may generate a data strobe signal DQS, which is changed from a static state (e.g., a high level or a low level) to a toggling state. The controller interface circuitry 5110 may transmit the data signal DQ including the data DATA to the memory device 5200 based on toggle time points of the data strobe signal DQS.

The controller interface circuitry 5110 may receive a ready/busy output signal nR/B from the memory device 5200 through the eighth pin P28. The controller interface circuitry 5110 may determine state information of the memory device 5200 based on the ready/busy output signal nR/B.

According to the present disclosure, a nonvolatile memory device may control a voltage of a dummy bit lines adjacent to a common source line such that a noise due to a current of the common source line is prevented from being introduced into bit lines and a time taken for the common source line or a bit line to reach an erase voltage in an erase operation is shortened. Accordingly, a nonvolatile memory device with improved reliability and improved performance and an operation method thereof are provided.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A nonvolatile memory device comprising:
a plurality of bit lines connected with a plurality of cell strings;
a common source line connected with the plurality of cell strings;
at least one dummy bit line provided between the common source line and the plurality of bit lines;
a control logic circuit configured to generate at least one dummy bit line driving signal in response to a command from an external device; and
a dummy bit line driver configured to selectively provide a first voltage to the at least one dummy bit line in response to the at least one dummy bit line driving signal, wherein the dummy bit line driver includes:
a first switch connected between the at least one dummy bit line and a first terminal receiving the first voltage and configured to operate in response to a first dummy bit line driving signal of the at least one dummy bit line driving signal; and
a second switch connected between the at least one dummy bit line and the common source line and configured to operate in response to a second dummy bit line driving signal of the at least one dummy bit line driving signal.

2. The nonvolatile memory device of claim 1, wherein the control logic circuit is configured to:
in response to determining that the command is not an erase command, generate the first dummy bit line driving signal such that the first switch is turned on; and
in response to determining that the command is the erase command, generate the first dummy bit line driving signal such that the first switch is turned off.

3. The nonvolatile memory device of claim 1, wherein the control logic circuit is configured to:
in response to determining that the command is not an erase command, generate the first and second dummy bit line driving signals such that the first switch is turned on and the second switch is turned off; and
in response to determining that the command is the erase command, generate the first and second dummy bit line driving signals such that the first switch is turned off and the second switch is turned on.

4. The nonvolatile memory device of claim 1, further comprising an erase voltage generator configured to generate an erase voltage and to provide the erase voltage to the common source line, the bit lines, or the common source line and the bit lines in an erase operation.

5. The nonvolatile memory device of claim 4, wherein the second switch is configured to selectively provide the erase voltage from the erase voltage generator to the at least one dummy bit line in response to the second dummy bit line driving signal of the at least one dummy bit line driving signal.

6. The nonvolatile memory device of claim 1, wherein the first voltage is a ground voltage.

7. The nonvolatile memory device of claim 6, wherein:
when the command is a read command, the dummy bit line driver is configured to:
apply a second voltage to the at least one dummy bit line while a precharge operation is performed on the plurality of bit lines; and
provide the first voltage to the at least one dummy bit line while a sensing operation is performed on the plurality of bit lines, and
the second voltage is a precharge voltage for the plurality of bit lines.

8. The nonvolatile memory device of claim 1, further comprising:
a page buffer circuit electrically connected with the plurality of bit lines, wherein:
the page buffer circuit and the dummy bit line driver are formed in a peripheral circuit area on a semiconductor substrate, and
the plurality of cell strings, the plurality of bit lines, the common source line, and the at least one dummy bit line are formed in a memory cell area on the peripheral circuit area.

9. The nonvolatile memory device of claim 8, wherein:
the plurality of bit lines respectively pass through first through plugs penetrating the memory cell area and are electrically connected with the page buffer circuit, and
the at least one dummy bit line is connected with the dummy bit line driver through at least one second through plug penetrating the memory cell area.

10. The nonvolatile memory device of claim 9, wherein:
the first through plugs and the at least one second through plug are formed above a plane where the page buffer circuit is formed,
the first through plugs are formed along a first direction so as to be spaced from each other as much as a first distance, and a distance between the at least one second through plug and one adjacent to the at least one second through plug in the first direction from among the first through plugs is a second distance smaller than the first distance.

11. A nonvolatile memory device comprising:
a peripheral circuit formed on a semiconductor substrate;
a memory cell array formed on the peripheral circuit and including a plurality of cell strings; and
a metal layer formed on the memory cell array, wherein:
the metal layer includes:
  a plurality of bit lines connected with the plurality of cell strings;
a common source line connected with the plurality of cell strings; and
  at least one dummy bit line provided between the plurality of bit lines and the common source line, and
the peripheral circuit includes:
  a control logic circuit configured to generate at least one dummy bit line driving signal in response to a command from an external device; and
  a dummy bit line driver configured to selectively provide a first voltage to the at least one dummy bit line in response to the at least one dummy bit line driving signal, wherein the dummy bit line driver includes:
    a first switch connected between the at least one dummy bit line and a first terminal receiving the first voltage and configured to operate in response to a first dummy bit line driving signal of the at least one dummy bit line driving signal; and
    a second switch connected between the at least one dummy bit line and the common source line and configured to operate in response to a second dummy bit line driving signal of the at least one dummy bit line driving signal.

12. The nonvolatile memory device of claim 11, wherein the peripheral circuit further includes a page buffer circuit electrically connected with the plurality of bit lines.

13. The nonvolatile memory device of claim 12, wherein the memory cell array further includes:
a plurality of first through plugs configured to electrically connect the plurality of bit lines and the page buffer circuit and formed in a direction perpendicular to the semiconductor substrate; and
at least one second through plug configured to electrically connect the at least one dummy bit line and the dummy bit line driver and formed in the direction perpendicular to the semiconductor substrate.

14. The nonvolatile memory device of claim 13, wherein the plurality of first through plugs and the at least one second through plug are formed in a bit line contact region.

15. The nonvolatile memory device of claim 11, wherein the control logic circuit is configured to:
in response to determining that the command is not an erase command, generate the at least one dummy bit line driving signal such that the first voltage is provided to the at least one dummy bit line; and
in response to determining that the command is the erase command, generate the at least one dummy bit line driving signal such that the at least one dummy bit line is floated, such that the at least one dummy bit line is connected with the common source line or such that an erase voltage is applied to the at least one dummy bit line.

16. An operation method of a nonvolatile memory device, the method comprising:
receiving a read command from an external device;
in response to the read command:
  applying, while a precharge operation is performed on a plurality of bit lines, a precharge voltage to at least one dummy bit line present between the plurality of bit lines and a common source line,
  providing a ground voltage, differing from the precharge voltage, to the at least one dummy bit line while a sensing operation is performed on the plurality of bit lines, and
  performing a read operation;
receiving an erase command from the external device;
in response to the erase command, floating the at least one dummy bit line, electrically connecting the at least one dummy bit line and the common source line, or applying an erase voltage to the at least one dummy bit line; and
performing an erase operation in response to the erase command.

17. The method of claim 16, wherein the plurality of bit lines are connected with a page buffer circuit and the at least one dummy bit line is connected with a dummy bit line driver.

18. The method of claim 16, wherein the erase operation includes an operation of applying the erase voltage to the common source line, the plurality of bit lines, or the common source line and the plurality of bit lines.

19. The nonvolatile memory device of claim 11, further comprising:
an erase voltage generator configured to generate an erase voltage and to provide the erase voltage to the common source line, the bit lines, or the common source line and the bit lines in an erase operation wherein:
the first voltage is a ground voltage, and
the second switch is configured to selectively provide the erase voltage from the erase voltage generator to the dummy bit line in response to the second dummy bit line driving signal of the at least one dummy bit line driving signal.

20. The nonvolatile memory device of claim 11, wherein:
the first voltage is a ground voltage,
when the command is a read command, the dummy bit line driver is configured to:
  apply a second voltage to the at least one dummy bit line while a precharge operation is performed on the plurality of bit lines; and
  provide the first voltage to the at least one dummy bit line while a sensing operation is performed on the plurality of bit lines, and
the second voltage is a precharge voltage for the plurality of bit lines.

* * * * *